United States Patent
Huang et al.

(10) Patent No.: US 10,692,817 B2
(45) Date of Patent: *Jun. 23, 2020

(54) SEMICONDUCTOR DEVICE WITH SHIELDING STRUCTURE FOR CROSS-TALK REDUCTION

(71) Applicant: Taiwan Semiconductor Manufacturing Company, Ltd., Hsinchu (TW)

(72) Inventors: Shih-Ya Huang, Hsinchu (TW); Chung-Hao Tsai, Huatan Township (TW); Chuei-Tang Wang, Taichung (TW); Chen-Hua Yu, Hsinchu (TW); Chih-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/388,635

(22) Filed: Apr. 18, 2019

(65) Prior Publication Data

US 2019/0252326 A1    Aug. 15, 2019

Related U.S. Application Data

(63) Continuation of application No. 15/950,722, filed on Apr. 11, 2018, now Pat. No. 10,269,728.

(Continued)

(51) Int. Cl.
*H01L 23/48* (2006.01)
*H01L 23/52* (2006.01)
(Continued)

(52) U.S. Cl.
CPC ........ *H01L 23/552* (2013.01); *H01L 21/6835* (2013.01); *H01L 23/50* (2013.01);
(Continued)

(58) Field of Classification Search
CPC ......... H01L 21/76802; H01L 21/76877; H01L 23/5226; H01L 23/498; H01L 2224/73265; H01L 24/83
(Continued)

(56) References Cited

U.S. PATENT DOCUMENTS

| 4,776,087 A | 10/1988 | Cronin et al. |
| 5,789,807 A * | 8/1998 | Correale, Jr. ....... H01L 23/5286 |
| | | 257/691 |

(Continued)

FOREIGN PATENT DOCUMENTS

| KR | 101650224 B1 | 8/2016 |
| TW | 201342502 | 10/2013 |

(Continued)

*Primary Examiner* — S. V. Clark
(74) *Attorney, Agent, or Firm* — Slater Matsil, LLP

(57) ABSTRACT

A method includes embedding a die in a molding material; forming a first dielectric layer over the molding material and the die; forming a conductive line over an upper surface of the first dielectric layer facing away from the die; and forming a second dielectric layer over the first dielectric layer and the conductive line. The method further includes forming a first trench opening extending through the first dielectric layer or the second dielectric layer, where a longitudinal axis of the first trench is parallel with a longitudinal axis of the conductive line, and where no electrically conductive feature is exposed at a bottom of the first trench opening; and filling the first trench opening with an electrically conductive material to form a first ground trench.

20 Claims, 28 Drawing Sheets

Related U.S. Application Data

(60) Provisional application No. 62/527,907, filed on Jun. 30, 2017.

(51) Int. Cl.
*H01L 29/40* (2006.01)
*H01L 23/552* (2006.01)
*H01L 23/528* (2006.01)
*H01L 23/00* (2006.01)
*H01L 23/522* (2006.01)
*H01L 23/538* (2006.01)
*H01L 23/50* (2006.01)
*H01L 21/683* (2006.01)
*H01L 21/56* (2006.01)
*H01L 23/31* (2006.01)

(52) U.S. Cl.
CPC ...... *H01L 23/5226* (2013.01); *H01L 23/5283* (2013.01); *H01L 23/5286* (2013.01); *H01L 23/5389* (2013.01); *H01L 24/02* (2013.01); *H01L 24/19* (2013.01); *H01L 24/20* (2013.01); H01L 21/568 (2013.01); H01L 23/3128 (2013.01); H01L 24/05 (2013.01); H01L 24/13 (2013.01); H01L 2221/68372 (2013.01); H01L 2224/0235 (2013.01); H01L 2224/02313 (2013.01); H01L 2224/02331 (2013.01); H01L 2224/02379 (2013.01); H01L 2224/02381 (2013.01); H01L 2224/04105 (2013.01); H01L 2224/05008 (2013.01); H01L 2224/0558 (2013.01); H01L 2224/05569 (2013.01); H01L 2224/05644 (2013.01); H01L 2224/05647 (2013.01); H01L 2224/11334 (2013.01); H01L 2224/11462 (2013.01); H01L 2224/12105 (2013.01); *H01L 2224/13006* (2013.01); *H01L 2224/13023* (2013.01); *H01L 2224/13024* (2013.01); *H01L 2924/18162* (2013.01)

(58) Field of Classification Search
USPC ......... 257/750, 758, 691; 438/622, 637, 638
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 10,269,728 | B2 * | 4/2019 | Huang ................. H01L 23/5389 |
| 2008/0251924 | A1 * | 10/2008 | Lin ..................... H01L 23/3192 257/758 |
| 2008/0251925 | A1 * | 10/2008 | Lin ....................... H01L 21/768 257/758 |
| 2009/0108369 | A1 | 4/2009 | Chu |
| 2010/0117228 | A1 * | 5/2010 | Yamamichi ......... H01L 23/3171 257/738 |
| 2014/0262475 | A1 | 9/2014 | Liu et al. |

FOREIGN PATENT DOCUMENTS

| | | |
|---|---|---|
| TW | 201709445 | 3/2017 |
| TW | 106711097 A | 5/2017 |
| TW | 201521171 | 6/2018 |

\* cited by examiner

US 10,692,817 B2

SEMICONDUCTOR DEVICE WITH SHIELDING STRUCTURE FOR CROSS-TALK REDUCTION

PRIORITY CLAIM AND CROSS-REFERENCE

This patent is a continuation of U.S. application Ser. No. 15/950,722, filed on Apr. 11, 2018, entitled "Semiconductor Device with Shielding Structure for Cross-talk Reduction", which claims priority to U.S. Provisional Application No. 62/527,907, filed Jun. 30, 2017, entitled "Integrated Fan-Out Package with Electromagnetic Shielding," which applications are hereby incorporated by reference in their entireties.

BACKGROUND

As semiconductor technologies further advance, new packaging techniques are used to accommodate the shrinking die size. For example, in an integrated fan-out (InFO) package, a die is embedded in a molding material. Redistribution structures are formed over the molding material and the die, which redistribution structures include conductive features such as conductive lines and vias formed in one or more dielectric layers. The conductive features of the redistribution structure are electrically coupled to the die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of forming electrically grounded shielding structures in a semiconductor package for reducing or eliminating cross-talk between signal lines. In accordance with some embodiments, ground trenches are formed in a redistribution structure of a semiconductor package. The ground trenches are disposed on opposing sides of a conductive line that carries information bearing signals. In some embodiments, ground vias are formed on top of and are connected to the ground trenches. In some embodiments, a ground plane is formed over the conductive line, the ground trenches, and the ground vias (if formed), and are connected to the grounded trenches and the ground vias (if formed). The ground trenches, ground vias (if formed), and the ground plane (if formed) form a grounded shielding structure (e.g., an electrically conductive structure that is grounded) around the conductive line to reduce cross-talk between the conductive line and neighboring conductive lines.

Figure 1:
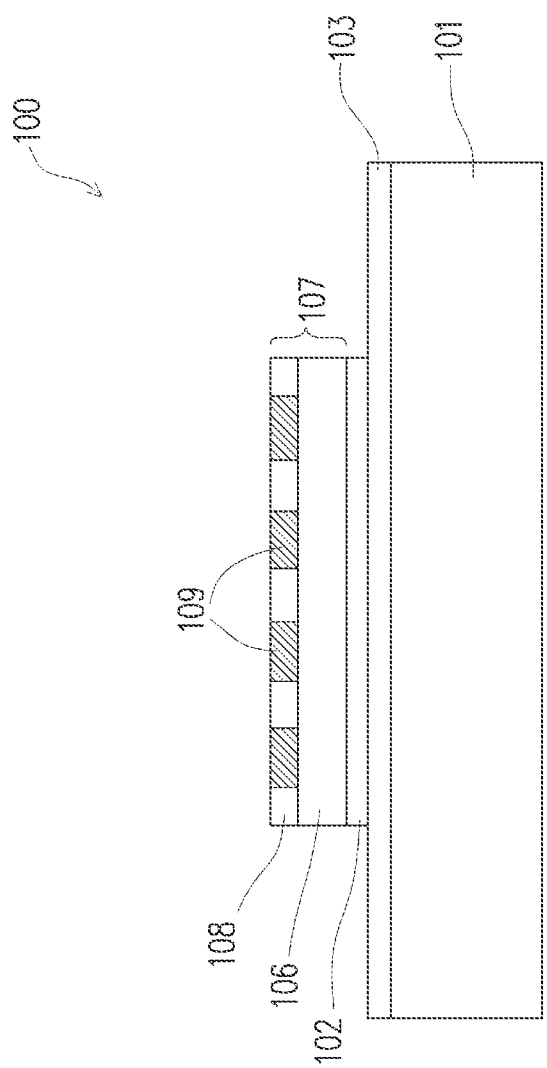
FIGS. 1-9 and 10A-10D illustrate cross-sectional views of a semiconductor device at various stages of fabrication, in accordance with an embodiment.

FIGS. 1-9 and 10A-10D illustrate cross-sectional views of a semiconductor device 100 at various stages of fabrication, in accordance with an embodiment. In FIG. 1, a semiconductor die 107 (may also be referred to as a die, a chip, or an integrated circuit (IC) die) is attached to a carrier 101. The carrier 101 may be made of a material such as silicon, polymer, polymer composite, metal foil, ceramic, glass, glass epoxy, beryllium oxide, tape, or other suitable material for structural support. A dielectric layer 103, which may serve as a release layer, is deposited or laminated over the carrier 101, as illustrated in the example of FIG. 1. The dielectric layer 103 may be photosensitive and may be easily detached from the carrier 101 by shining, e.g., an ultra-violet (UV) light on the carrier 101 in a subsequent carrier de-bonding process. For example, the dielectric layer 103 may be a light-to-heat-conversion (LTHC) coating made by 3M Company of St. Paul, Minn.

As illustrated in FIG. 1, the die 107 is attached to the dielectric layer 103 via an adhesive layer 102, which may be a die attaching film (DAF), a glue layer, or other suitable material. Before being adhered to the dielectric layer 103, the die 107 may be processed according to applicable manufacturing processes to form integrated circuits in the die 107. For example, the die 107 includes a semiconductor substrate 106, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not shown), such as transistors, diodes, capacitors, resistors, etc., may be formed in and/or on the semiconductor substrate 106 and may be interconnected by interconnect structures (not shown) formed by, for example, metallization patterns in one or more dielectric layers on the semiconductor substrate 106 to form an integrated circuit.

The die 107 further comprise pads (also referred to as contact pads, not shown), such as aluminum pads, to which external connections are made. The pads are on what may be referred to as an active side or a front side of the die 107. Passivation films (not shown) are on the active side of die 107 and on portions of the pads. Openings are formed through the passivation films to the pads. Die connectors 109, such as conductive pillars (e.g., comprising a metal such as copper), are in the openings through passivation films and are mechanically and electrically coupled to the respective pads. The die connectors 109 may be formed by, for example, plating, or the like. The die connectors 109 electrically couple the integrated circuit of the die 107.

A dielectric material 108 is on the active sides of the die 107, such as on the passivation films and the die connectors 109. The dielectric material 108 laterally encapsulates the die connectors 109, and the dielectric material 108 is laterally coterminous with the die 107. The dielectric material 108 may be a polymer such as polybenzoxazole (PBO), polyimide, benzocyclobutene (BCB), or the like; a nitride such as silicon nitride or the like; an oxide such as silicon oxide; phosphosilicate glass (PSG), borosilicate glass (BSG), boron-doped phosphosilicate glass (BPSG), or the like; or a combination thereof, and may be formed, for example, by spin coating, lamination, CVD, or the like.

Figure 2:
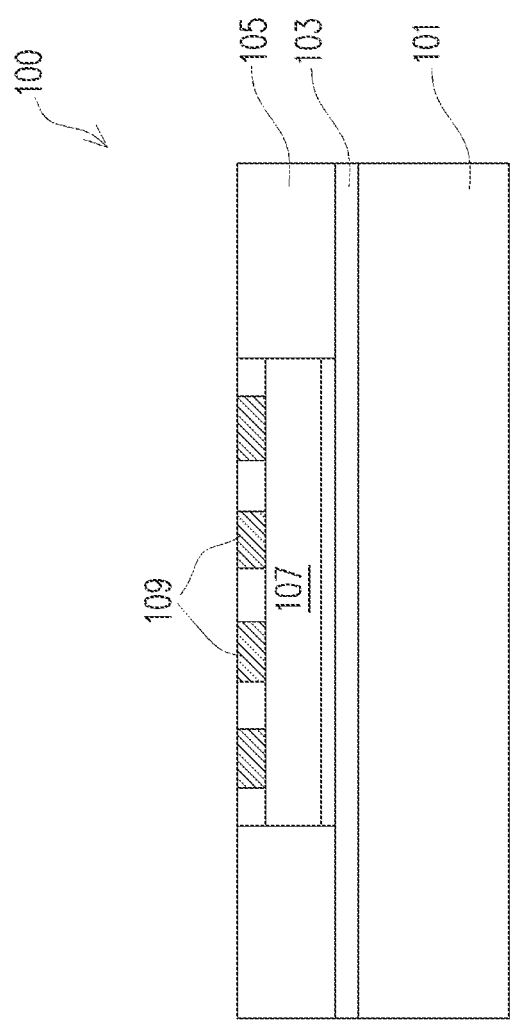

Next, in FIG. 2, a molding material 105 is formed over the dielectric layer 103 to encapsulate the die 107. The molding material 105 may comprise an epoxy, an organic polymer, a polymer with or without a silica-based or glass filler added, or other materials, as examples. In some embodiments, the molding material 105 comprises a liquid molding compound (LMC) that is a gel type liquid when applied. The molding material 105 may also comprise a liquid or solid when applied. Alternatively, the molding material 105 may comprise other insulating and/or encapsulating materials. The molding material 105 is applied using a wafer level molding process in some embodiments. The molding material 105 may be molded using, for example, compressive molding, transfer molding, or other suitable methods.

Next, the molding material 105 is cured using a curing process, in some embodiments. The curing process may comprise heating the molding material 105 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 105 may be cured using other methods. In some embodiments, a curing process is not included.

After the molding material 105 is deposited and cured (if needed), a planarization process, such as chemical mechanical polish (CMP), is performed to remove a top portion of the molding material 105 and to expose upper surfaces of the die connectors 109 of the die 107, in some embodiments.

Figure 3:
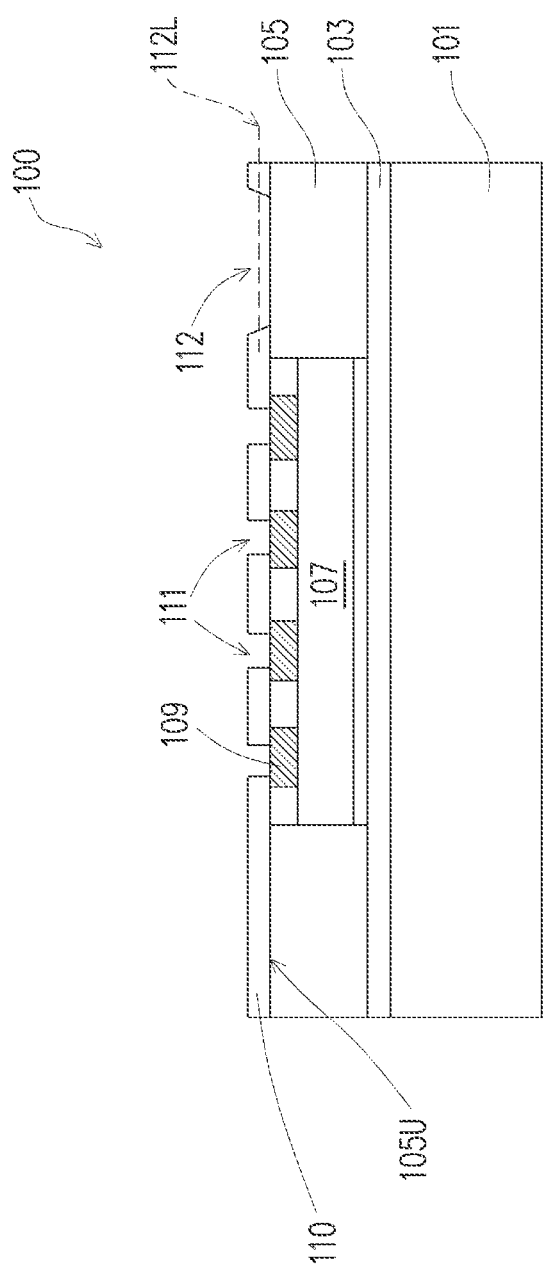

Next, in FIG. 3, a dielectric layer 110 is formed over the molding material 105 and the die 107. The dielectric layer 110 is formed of a polymer, such as PBO, polyimide, BCB, or the like. In other embodiments, the dielectric layer 110 is formed of a nitride such as silicon nitride; an oxide such as silicon oxide; PSG, BSG, BPSG, or the like; or the like. The dielectric layers 110 may be formed by any acceptable deposition process, such as spin coating, chemical vapor deposition (CVD), laminating, the like, or a combination thereof. A planarization process, such as CMP, may be performed to achieve a planar upper surface for the dielectric layer 110.

Next, the dielectric layer 110 is patterned using, e.g., lithography and/or etching processes to form openings, such as via openings 111 and trench openings 112. The via openings 111 expose the die connectors 109, in the example of FIG. 3. The trench opening 112 in FIG. 3 exposes the molding material 105, and no electrically conductive feature (e.g., conductive lines, vias, or die connectors) is exposed by the bottom of the trench opening 112. A longitudinal axis 112L of the trench opening 112 is parallel to an upper surface 150U of the molding material 105, which upper surface 105U is parallel to the upper surfaces of the dielectric layers (e.g., 110, 120, 130 and 140, see FIG. 9) disposed over the molding material 105, in some embodiments. The longitudinal axis 112L of the trench opening 112 is parallel to a longitudinal axis 113SL of a signal line 113S (see FIG. 10D) formed in subsequent processing, in some embodiments. The location of the trench opening 112 as illustrated in FIG. 3 is merely a non-limiting example. The trench openings 112 may be formed over any other suitable region, such as over (e.g., directly over) the die 107. In embodiments where the trench opening 112 is formed directly over the die 107, the trench opening 112 is formed over areas of the die 107 that does not have conductive features (e.g., die connectors 109 of FIG. 3, or line vias 104 of FIG. 17A), thus no electrically conductive feature is exposed by the bottom of the trench opening 112. These and other variations are fully intended to be included within the scope of the present disclosure.

Figure 4:
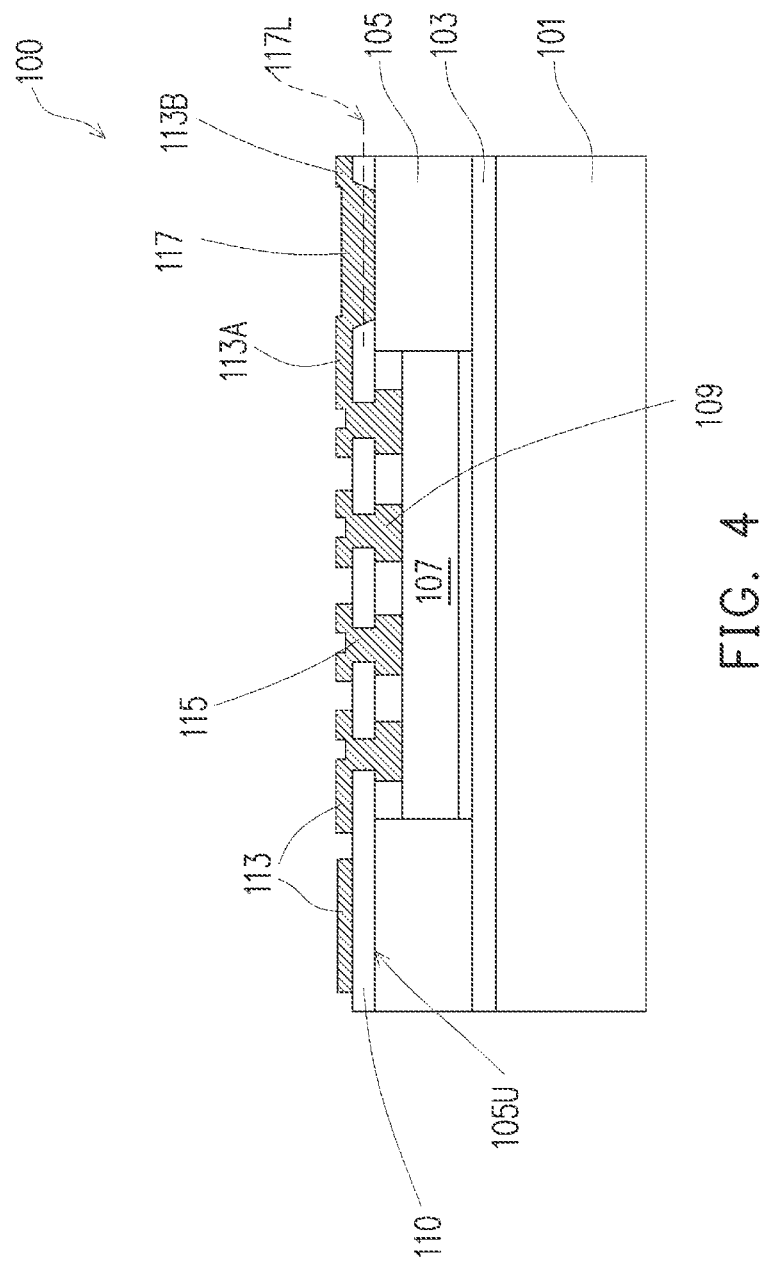

Next, in FIG. 4, electrically conductive features, such as conductive lines 113, conductive vias 115, and ground trenches 117 are formed over and/or in the dielectric layer 110. The conductive features may be formed of a suitable conductive material such as copper, titanium, tungsten, aluminum, or the like. The conductive features may be formed by, e.g., forming a seed layer over the dielectric layer 110 and in the openings 111/112, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. In other embodiments, the conductive features are formed by a subtractive process, e.g., by blanket deposition of the conductive material over the upper surface of the dielectric layer 110, followed by patterning and/or etching of the deposited conductive material.

Note that ground trenches 117 are formed by filling the trench openings 112 (see FIG. 3) with an electrically conductive material. Since no electrically conductive feature is exposed by the bottom of the trench opening 112, no electrically conductive feature is connected to (e.g., physically contacts) the bottom surface of the ground trench 117, in some embodiments. Therefore, the bottom surface of the ground trench 117 physically contacts a dielectric material (e.g., the molding material 105), in some embodiments. In contrast, the conductive via 115 is formed such that a bottom surface of the conductive via 115 is connected with (e.g., physically contacts) an underlying electrically conductive feature. Compared with the conductive via 115, which may have a longitudinal axis perpendicular to the upper surface 105U of the molding material 105, the ground trench 117 has a longitudinal axis 117L (see also FIG. 10D) parallel to the upper surface 105U of the molding material 105. In the illustrated example of FIG. 4, the ground trench 117 is electrically coupled to other electrically conductive features (e.g., conductive lines 113A and 113B) through an upper surface of the ground trench 117 or through an upper portion of the ground trench 117 that is disposed over the upper surface of the dielectric layer 110, in some embodiments. More details of the ground trench are discussed hereinafter with reference to FIGS. 10A-10D.

Figure 5:
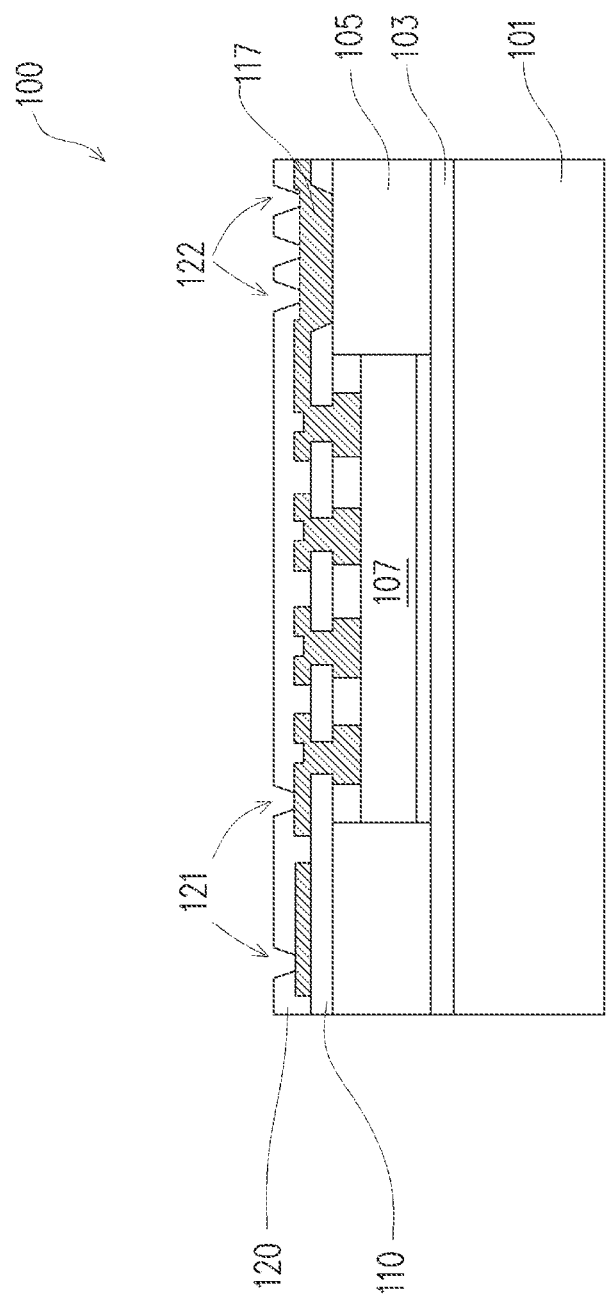

Next, in FIG. 5, a dielectric layer 120 is formed over the dielectric layer 110 and the conductive features (e.g., 113, 115, and 117) formed in FIG. 4. The dielectric layer 120 may comprise a same or a similar material as the dielectric layer 110, and may be formed by a same or similar formation method as the dielectric layer 110, thus details are not repeated. A planarization process, such as CMP, may be performed to achieve a planar upper surface for the dielectric layer 120.

Next, the dielectric layer 120 may be patterned, e.g., by photolithography and/or etching processes, to form openings 121 and 122. Openings 121 expose underlying conductive features, such as conductive lines 113 and/or conductive vias 115, and openings 122 expose the ground trench 117, in some embodiments.

Figure 6:
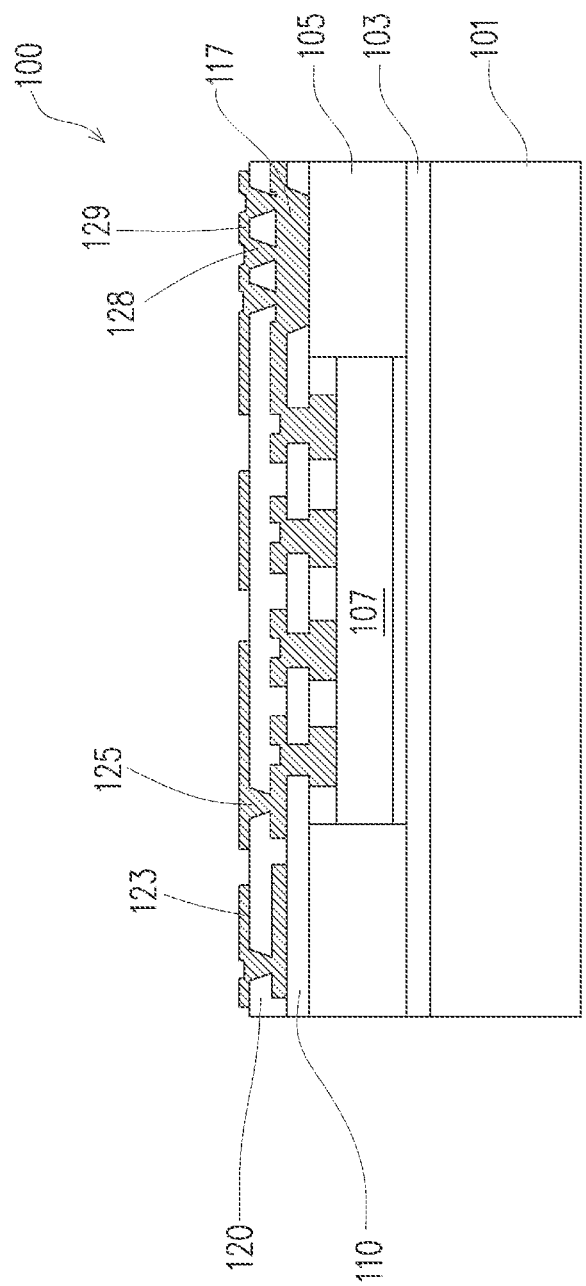

Next, in FIG. 6, electrically conductive features, such as conductive lines 123/129 and conductive vias 125/128 are formed over and/or in the dielectric layer 120. The conductive features 123, 129, 125, and 128 may be formed of a same or a similar material as the conductive features 113 and 115, and may be formed using a same or similar method as the conductive features 113 and 115, thus details are not repeated.

The conductive vias 128 are electrically and mechanically coupled to the ground trench 117, in the illustrated embodiment. The conductive vias 128 may also be connected together by the conductive line 129 disposed over the upper surface of the dielectric layer 120, as illustrated in FIG. 6. The conductive vias 128 over a same ground trench 117 are disposed along a line, which may overlap with or be parallel to (see FIG. 10C) the longitudinal axis 117L of the ground trench 117, in some embodiments. As discussed in more details hereinafter, the conductive vias 128 are electrically grounded and form an electrically grounded shielding structure with the ground trenches 117 to reduce cross-talk, thus the conductive vias 128 are also referred to as ground vias 128 in the discussion hereinafter. More details of the ground vias 128 are discussed hereinafter with reference to FIGS. 10A-10D.

Figure 7:
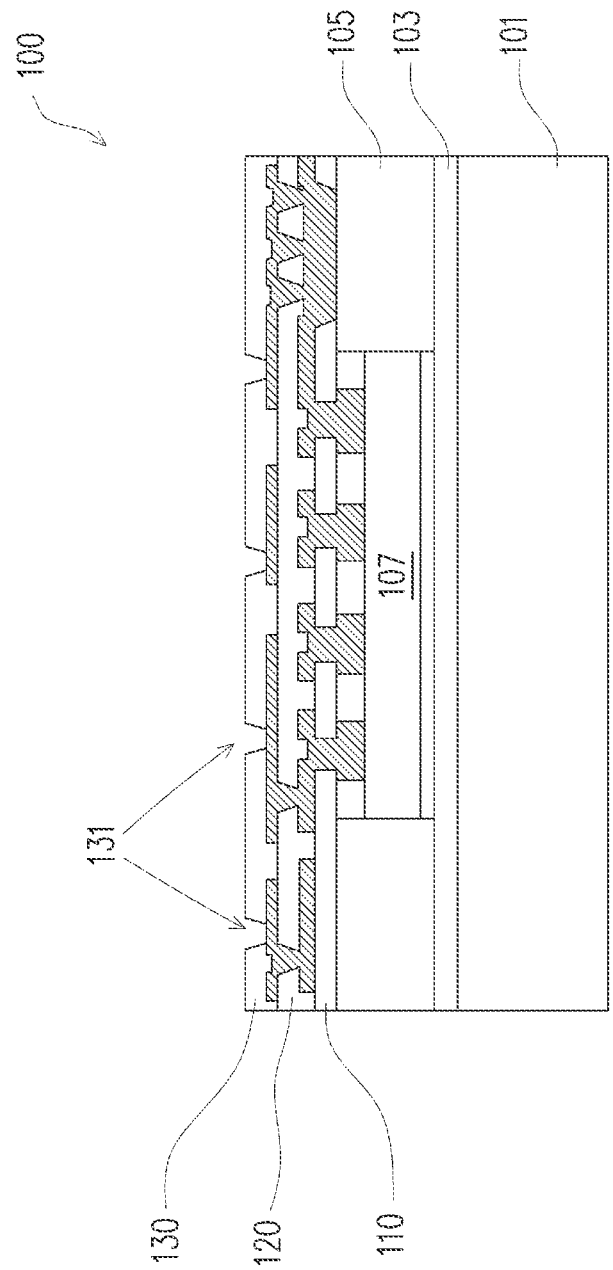

Next, in FIG. 7, a dielectric layer 130 is formed over the dielectric layer 120 and the conductive features 123, 125, 128, and 129, and is patterned to form openings 131, which openings 131 expose respective underlying conductive features. The dielectric layer 130 may comprise a same or a similar material as the dielectric layer 110, and may be formed by a same or similar formation method as the dielectric layer 110, thus details are not repeated. A planarization process, such as CMP, may be performed to achieve a planar upper surface for the dielectric layer 130.

Figure 8:
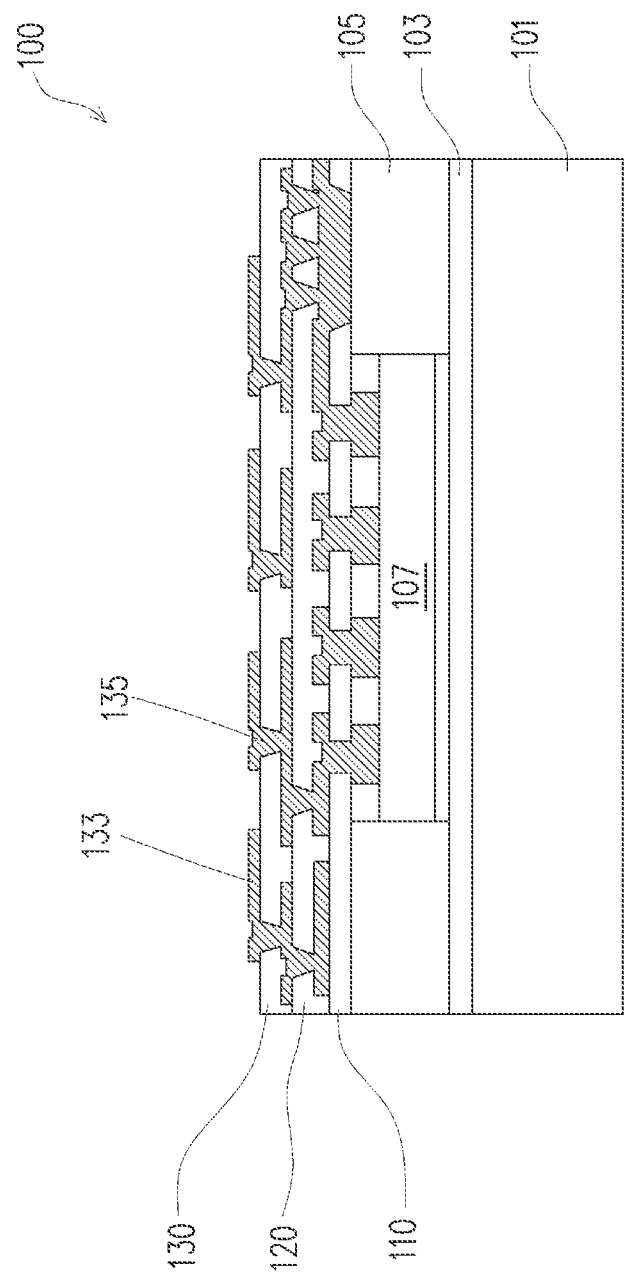

Next, in FIG. 8, electrically conductive features, such as conductive lines 133 and conductive vias 135 are formed over and/or in the dielectric layer 130. The conductive features (e.g., 133, 135) may be formed of a same or a similar material as the conductive features 113 and 115, and may be formed using a same or similar method as the conductive features 113 and 115, thus details are not repeated. In some embodiments, the conductive features over the dielectric layer 130 may also include conductive pads that will be electrically coupled to under-bump-metallurgy (UBM) structures formed in subsequent processing, which conductive pads are electrically coupled to one or more of the conductive features 133/135.

Figure 9:
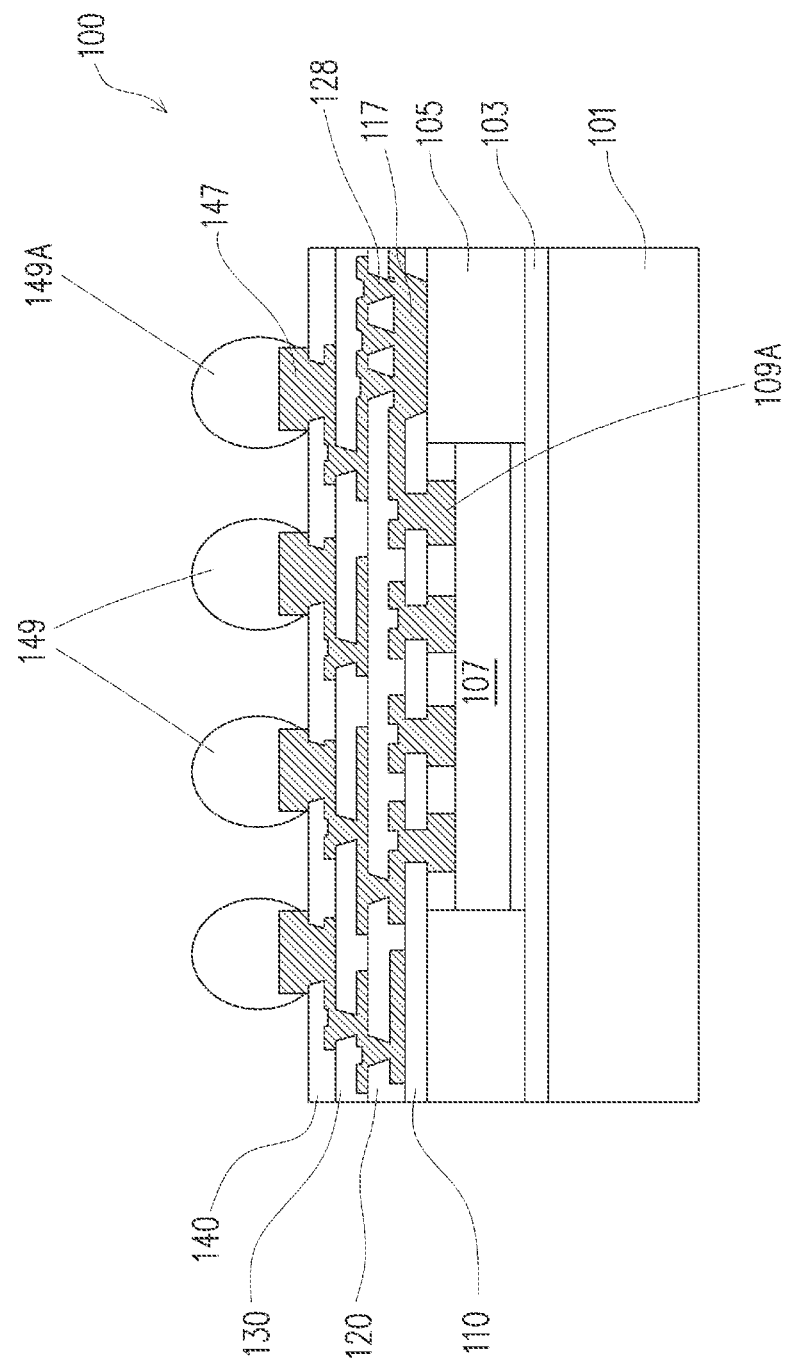

Referring next to FIG. 9, a dielectric layer 140 is formed over the dielectric layer 130 and the conductive features 133/135. The dielectric layer 140 may comprise a same or a similar material as the dielectric layer 110, and may be formed by a same or similar formation method as the dielectric layer 110, thus details are not repeated. A planarization process, such as CMP, may be performed to achieve a planar upper surface for the dielectric layer 140.

Next, openings (not shown) are formed in the dielectric layer 140 to expose the conductive pads over the dielectric layer 130, using, e.g., photolithography and/or etching processes. Once the openings are formed, UBMs 147 may be formed in electrical contact with the conductive pad. In an embodiment, the UBMs 147 comprises three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 147. Any suitable materials or layers of material that may be used for the UBMs 147 are fully intended to be included within the scope of the present disclosures.

The UBMs 147 may be created by forming each layer over the dielectric layer 140 and along the interior of the openings through the dielectric layer 140 to the conductive pad. The forming of each layer may be performed using a plating process, such as electrochemical plating, although other processes of formation, such as sputtering, evaporation, or PECVD process, may alternatively be used depending upon the materials used. Once the layers of the UBM have been formed, a suitable photolithographic and/or etching process(es) may be performed to remove portions of the layers and to leave the UBMs 147 in a designed shape, such as a circular, octagonal, square, or rectangular shape, although any suitable shape may alternatively be formed.

Still referring to FIG. 9, external connectors 149 are formed on the UBMs 147. In an embodiment, the external connectors 149 are contact bumps such as controlled collapse chip connection (C4) bumps and comprise a material such as tin, or other suitable materials, such as silver or copper. In an embodiment in which the external connectors 149 are tin solder bumps, the external connectors 149 may be formed by initially forming a layer of tin through any suitable method such as evaporation, electroplating, printing, solder transfer, ball placement, or the like. Once a layer of tin has been formed on the structure, a reflow is performed in order to shape the material into the bump shape with a diameter, e.g., of about 80 μm.

However, while the external connectors 149 have been described above as C4 bumps, these are merely intended to be illustrative and are not intended to limit the embodiments. Rather, any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 149, and all such external connectors are fully intended to be included within the scope of the embodiments.

As illustrated in FIGS. 3-9, the conductive features, such as conductive lines 113/conductive vias 115 (see FIG. 4), conductive lines 123/conductive vias 125 (see FIG. 6), and conductive lines 133/conductive vias 135 (see FIG. 8), re-route or redistribute signals to/from the die 107, thus are referred to as redistribution layers (RDLs). The redistribution layers, together with the associated dielectric layers, such as 110, 120, 130 and 140, are collectively referred to as a redistribution structure.

In the illustrated example of FIG. 9, the ground trenches 117 and the ground vias 128 are electrically coupled to one or more external connectors 149A via the conductive lines and/or the conductive vias of the redistribution structure. The external connectors 149A are electrically coupled to electrical ground (not shown), thus grounding the ground trenches 117 and the ground vias 128, in some embodiments. The ground trenches 117 and the ground vias 128 may also be electrically coupled to one or more die connector 109A, which die connectors 109A are configured to be electrically grounded. The ground trenches 117 and the ground vias 128, which are electrically coupled to the electrical ground (e.g., having a same voltage as the electrical ground), are used to provide shielding from electromagnetic interferences (e.g., cross-talk), in some embodiments. In some embodiments, the ground trenches 117 and the ground vias 128 are electrically coupled to a power supply (e.g., having a same voltage as a power supply such as a 5V or 3V power supply, not shown) to provide shielding from electromagnetic interferences. For analysis of high frequency electromagnetic signals (e.g., electromagnetic interferences), the electrical ground and the power supply in a system may be regarded as being electrically shorted, and therefore, the ground trenches 117 and the ground vias 128, when coupled to the power supply, may also provide shielding from electromagnetic interferences. In other words, to provide shielding from electromagnetic interferences, the ground trenches 117 and the ground vias 128 may be directly coupled to the electrical ground, or directly coupled to the power supply. The discussion of various embodiments herein may use the example where the ground trenches (e.g., 117) and/or the ground vias (e.g., 128) are electrically coupled (e.g., directly coupled) to the electrical ground to provide shielding from electromagnetic interferences, with the understanding that the ground trenches (e.g., 117) and/or the ground vias (e.g., 128) may also be electrically coupled (e.g., directly coupled) to the power supply to provide shielding from electromagnetic interferences. In other words, in the various embodiments discussed herein, the electrical ground or the ground plane (e.g., a copper plane directly coupled to the electrical ground) coupled with the ground trenches 117 and/or the ground vias 128 for electromagnetic shielding may be replaced with the power supply or the power plane (e.g., a copper plane directly coupled to the power supply). These and other variations are fully intended to be included within the scope of the present disclosure.

Although the ground trenches 117 and the ground vias 128 are formed in the same processing steps as the redistribution structure, the ground trenches 117 and the ground vias 128 are not used for routing information bearing signals (e.g., digital waveforms carrying control signals and/or data signals) to/from the die 107. Instead, the ground trenches 117 and the ground vias 128 form an electrically conductive structure which is electrically grounded, and the electrically grounded conductive structure functions as a shielding structure to reduce or eliminate cross-talk between adjacent signal lines, as will be discussed in more details with reference to FIGS. 10A-10D.

Figure 10A:
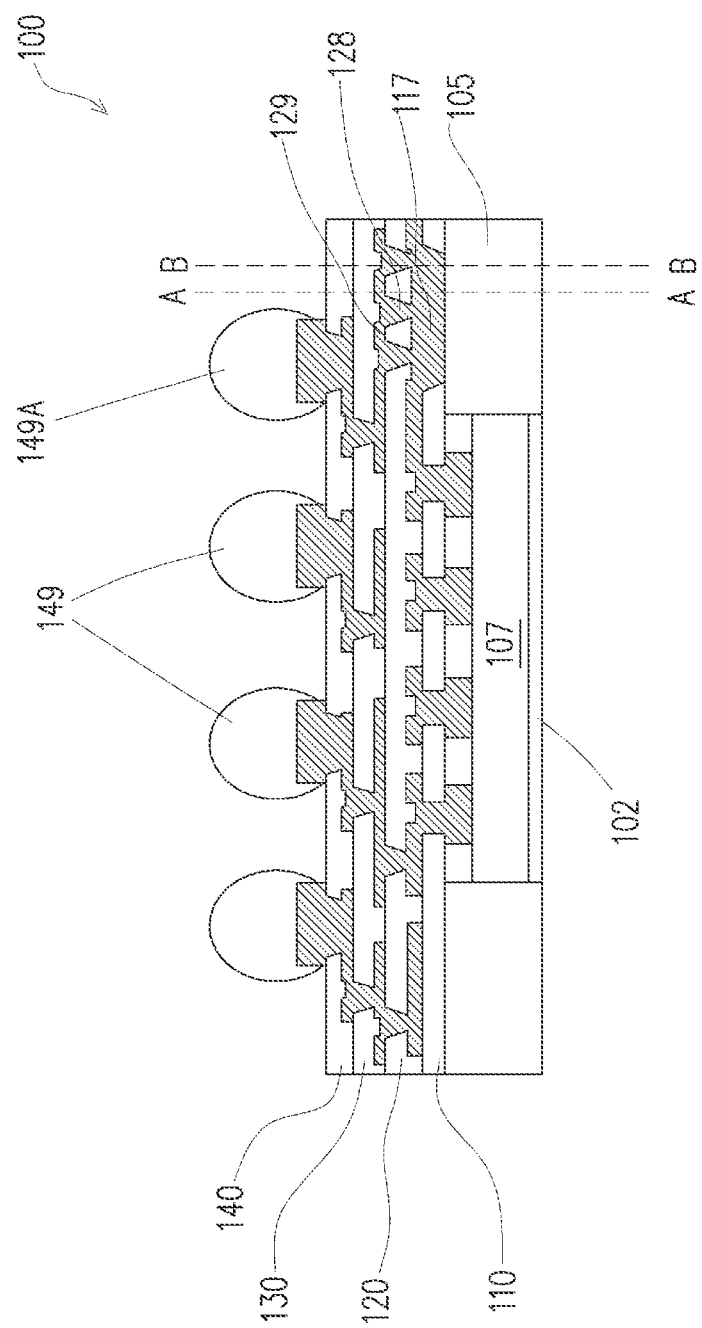

Referring now to FIG. 10A, a carrier de-bonding processing is performed to remove the carrier 101. In some embodiments, the semiconductor device 100 in FIG. 9 is flipped over (not shown), and the external connectors 149 are attached to a tape (not shown) supported by a frame (not shown). The tape may be a dicing tape, which may be adhesive, for holding the semiconductor device 100 in place in subsequent processing. Next, the carrier 101 is detached (de-bonded) from the semiconductor device 100 through a de-bonding process. The de-bonding process may remove carrier 101 using any suitable process, such as etching, grinding, and mechanical peel off. In some embodiments, carrier 101 is de-bonded by shining a laser or UV light over the surface of carrier 101. The laser or UV light breaks the chemical bonds of the dielectric layer 103 that binds to the carrier 101, and carrier 101 can then be easily detached. Although not shown, a dicing processing may be performed after the carrier de-bonding process to singulate the plurality of semiconductor devices formed over carrier 101 into individual semiconductor devices 100.

Figure 10B:
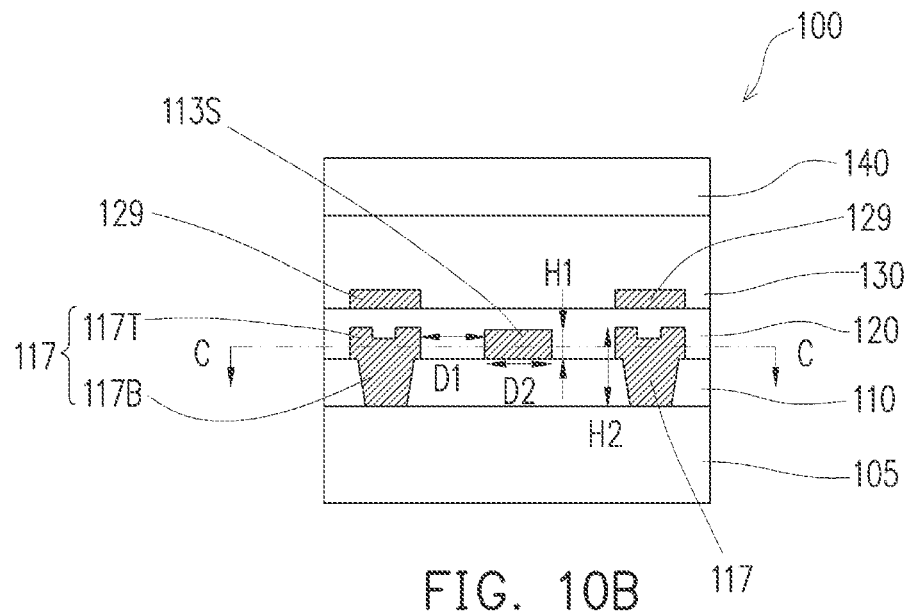
Figure 10C:
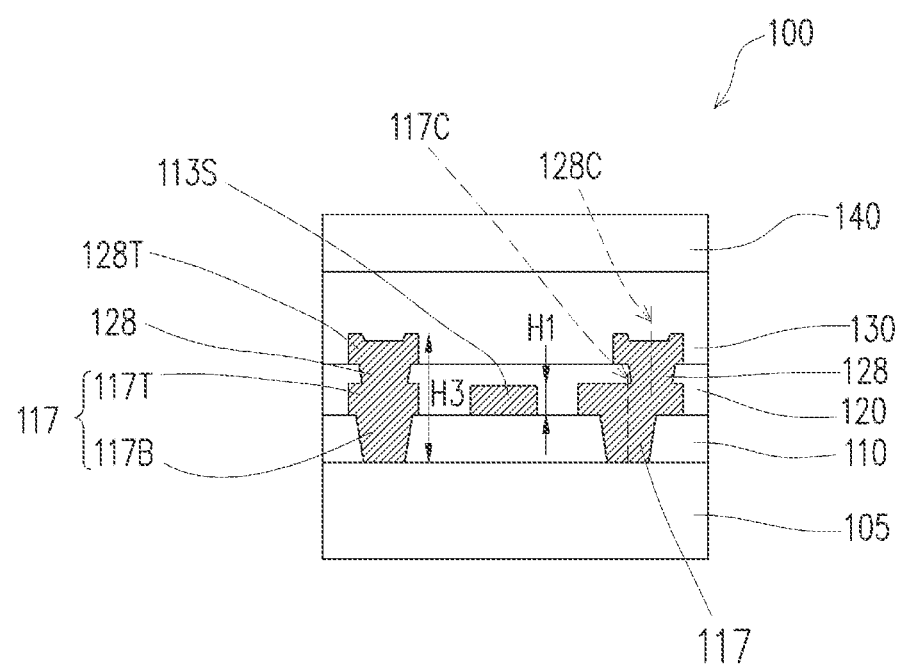

FIGS. 10B and 10C illustrate cross-sectional views of the semiconductor device 100 along cross-sections A-A and B-B, respectively. Note that cross-section B-B is across the ground via 128, whereas cross-section A-A is between two adjacent ground vias 128. Referring to FIG. 10B, two ground trenches 117 extend through the dielectric layer 110. A conductive line 113S is over the upper surface of the dielectric layer 110 and between the two ground trenches 117. Although one of the ground trenches 117 and the conductive line 113S are not visible in the cross-sectional views of FIGS. 1-9 and 10A, one skilled in the art, upon reading FIGS. 10B-10D, will appreciate that the features illustrated in FIGS. 10B-10D, such as the two ground trenches 117 and the conductive line 113S, are formed in corresponding processing steps of the process flow illustrated in FIGS. 1-9.

Referring to FIG. 10B, the ground trench 117 has an upper portion 117T over the upper surface of the dielectric layer 110 and a lower portion 117B between the upper surface of the dielectric layer 110 and the lower surface of the dielectric layer 110. Due to various factors such as the deposition process used to fill the trench opening 112 and/or the size of the trench opening 112, an upper surface of a center region of the upper portion 117T may be lower (e.g., closer to the molding material 105) than an upper surface of a peripheral region of the upper portion 117T, in some embodiments. The lower portion 117T of the ground trench 117, which is surrounded by the dielectric layer 110, extends from the lower surface of the dielectric layer 110 facing the molding material 105 to the upper surface of the dielectric layer 110 facing away from the molding material 105, as illustrated in FIG. 10B. The lower portion of the ground trench 117 may have tapering sidewalls. In other words, the lower portion of the ground trench 117 may have a trapezoidal cross-section, which may due to tapering sidewalls of the trench opening 112 caused by the photolithography and etching process used to form the trench opening 112.

Still referring to FIG. 10B, the conductive line 113S (also referred to as signal line) carries information bearing signals, such as digital waveforms that represent control signals or data signals. A control signal may comprise a time-varying voltage that switches among a plurality of pre-determined voltage levels, as an example. A data signal may be a base-band (e.g., un-modulated) signal or a modulated signal (e.g., modulated to a carrier frequency). The data signal may carrier information bits that represent voice, text, image, video, or the like, and the information bits may be mapped to data symbols using various mapping and modulation schemes such as amplitude shift keying (ASK), phase shift keying (PSK), frequency shift keying (FSK), quadrature amplitude modulation (QAM), or the like.

As integration density becomes increasing higher in semiconductor manufacturing, the distance between adjacent signal lines becomes closer. Cross-talk may happen between closely spaced signal lines (e.g., conductive line 113S) through various coupling mechanisms, such as capacitive coupling, inductive coupling, or conductive coupling. Due to cross-talk, a first signal transmitted on a first signal line may interfere with a second signal transmitted on a second signal line, thereby causing distortion of the second signal and reducing the signal integrity of the second signal. Conversely, the second signal may interfere with the first signal and reduce the signal integrity of the first signal. Various embodiments of shielding structures, e.g., electrically conductive structures which are grounded and which shield a signal line from other nearby signal lines, are disclosed in the present disclosure for reducing or eliminating cross-talk, thus improving the signal integrity and performance of the semiconductor device.

Still referring to FIG. 10B, a height $H_1$ of the signal line 113S is smaller than a height $H_2$ of the ground trench 117, wherein $H_1$ and $H_2$ are measured along a direction perpendicular to the upper surface of the molding material 105. In other words, a ratio of $H_2/H_1$ is larger than 1. The larger height $H_1$ helps to shield the signal line 113S from nearby or adjacent signal lines, thus reducing the cross-talk.

In some embodiments, a ratio of $D_1/D_2$ is larger than or equal to 0.1 and smaller than or equal to 5 (e.g., $0.1<D_1/D_2<5$), where $D_2$ is the width of the signal line 113S, and $D_1$ is the distance between signal line 113S and the ground trench 117. In some embodiments, the ratio of $D_1/D_2$ is determined by the characteristics of the electromagnetic (EM) field of the signal line (e.g., 113S) to ensure effective shielding provided by the ground trench (e.g., 117). For example, if the ratio of $D_1/D_2$ is too small (e.g., smaller than 0.1), e.g., due to the ground trench 117 being too close to the signal line 113S, the EM field of the signal line 113S may be too strong at the location of the ground trench 117, and may cross the ground trench 117 to adversely affect another signal line (not shown) on an opposing side of the ground trench 117 from the signal line 113S. On the other hand, if the ratio of $D_1/D_2$ is too large (e.g., larger than 5), e.g., due to the ground trench 117 being far away from the signal line 113S, the EM field of the signal line 113S at the location of the ground trench 117 may be weak, in which case the ground trench 117 may not be needed. FIG. 10B also illustrates the conductive lines 129 which are disposed on the upper surface of the dielectric layer 120. The conductive lines 129 are disposed over the ground trenches 117, and connect the ground vias 128 (see FIG. 10A) together.

FIG. 10C illustrates the cross-sectional view of the semiconductor device 100 in FIG. 10A, but along cross-section B-B. FIG. 10C is similar to FIG. 10B, but with the ground vias 128 illustrated in the cross-sectional view. In the illustrated example of FIG. 10C, each ground via 128 has an upper portion 128T on the upper surface of the dielectric layer 120. The lower portion of the ground via 128 is in the dielectric layer 120 and is between the upper portion 128T of the ground via 128 and the upper portion 117T of a corresponding ground trench 117. Therefore, the ground via 128 and the corresponding ground trench 117 are electrically connected. In some embodiments, a total height $H_3$ of ground via 128 and the ground trench 117 is twice or more than (e.g., twice to five times) the height $H_1$ of the signal line 113S, where the height $H_3$ and the height $H_1$ are measured along the direction perpendicular to the upper surface of the molding material 105. For example, the height $H_1$ may be between about 0.5 µm and about 10 µm, and depending on the height $H_1$, the height $H_3$ may be between about 2 µm and about 50 µm. Note that as illustrated in FIG. 10C, the bottom surface of the ground trench 117 contacts a dielectric material (e.g., molding material 105), and the sidewalls of the lower portion 117B of the ground trench 117 are surrounded by the dielectric layer 110, thus no electrically conductive feature is connected to (e.g., directly contacts) the bottom surface of the ground trench 117 or connected to the lower portion 117B of the ground trench 117. Instead, electrical connection of the ground trench 117 to another electrically conductive feature is achieved through the upper portion 117T of the ground trench 117, e.g., through the ground vias 128 or through the conductive lines 113A/113B (see FIG. 4). In other words, electrical connection of the ground trench 117 to another electrically conductive feature is achieved only through the upper portion 117T of the ground trench 117, in some embodiments.

In the example of FIG. 10C, the ground via 128 on the right is misaligned with the ground trench 117 on the right, thus a center axis 128C of the ground via 128 on the right is not aligned with (e.g., not on a same line with) a center axis 117C of the underlying ground trench 117, although 128C and 117C may be parallel to each other and may both be perpendicular to the upper surface of the molding material 105. In contrast, the ground via 128 on the left is vertically aligned with (e.g., directly over) the ground trench 117 on the left, thus the center axis of the ground via 128 on the left is aligned with (e.g., on a same line with) with the center axis of the ground trench 117 on the left. By allowing for misalignment of the ground vias 128 and the underlying ground trenches 117, the requirements for the accuracy of the patterning process (e.g., photolithography process) is reduced, and a larger error margin is allowed, which allows for lost-cost production and also helps to improve the yield of the manufacturing process. The misalignment of the ground vias 128 and the underlying ground trenches 117 also makes it easier to pattern the layout of the semiconductor device 100.

FIG. 10C is a non-limiting example. Other configurations are possible. For example, the ground vias 128 on the left and right may each be aligned with a corresponding underlying ground trench 117. As another example, the ground vias 128 on the left and right may each be misaligned with the corresponding underlying ground trench 117. In the example of FIG. 10C, a lateral distance (e.g., measured along a horizontal direction in FIG. 10C) between the ground via 128 on the right and the signal line 113S is larger than a lateral distance between the ground trench 117 on the right and the signal line 113S. In other words, the ground via 128 on the right is further from the signal line 113S than the underlying ground trench 117. This is an example and not intended to be limiting, and other configurations are possible. For example, the ground via 128 may be closer to the signal line 113S than the underlying ground trench 117. As another example, one of the ground vias 128 (e.g., on the left or on the right) illustrated in FIG. 10C may be closer to the signal line 113S than the underlying ground trench 117, while the other one of the ground vias 128 may be further from the signal line 113S than the underlying ground trench 117. These and other variations are fully intended to be included within the scope of the present disclosure.

Figure 10D:
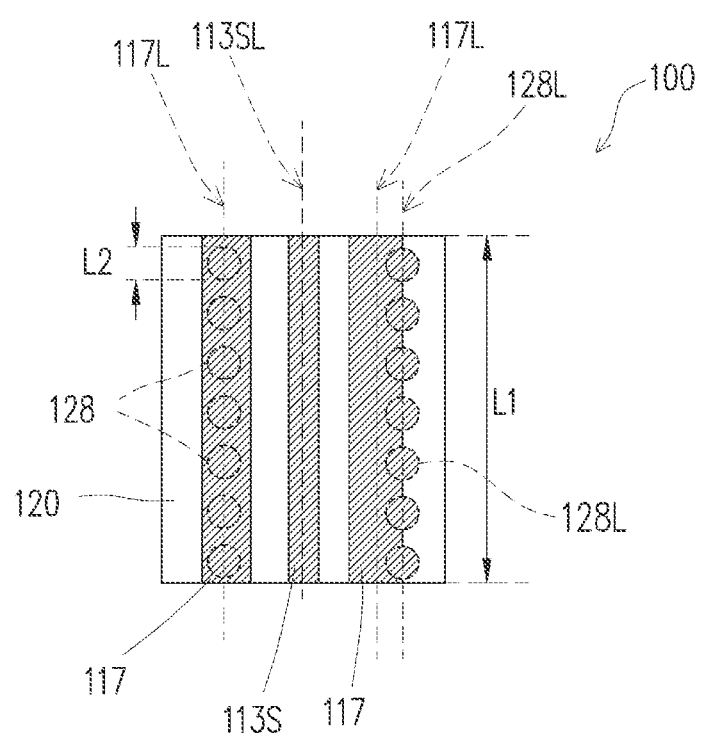

FIG. 10D is a cross-sectional of the semiconductor device 100 in FIG. 10B along cross-section C-C. As illustrated in FIG. 10D, a longitudinal axis 117L of the ground trenches 117 is parallel to a longitudinal axis 113SL of the signal line 113S. Therefore, the ground trench 117 is parallel to at least the illustrated portion of the signal line 113S. The ground vias 128 are not in the cross-section C-C, thus are shown in phantom in FIG. 10D. In the illustrated embodiment, the centers of the plurality of ground vias 128 on the left are aligned (e.g., overlap) with the longitudinal axis 117L of the underlying ground trench 117. The centers of the plurality of ground vias 128 on the right, however, are on a line 128L which is parallel to, but not overlapping with, the longitudinal axis 117L of the underlying ground trench 117. Note that the longitudinal axis 117L of the ground trenches 117 is parallel to the upper surface of the molding material 105, as illustrated in FIG. 10D. A longitudinal axis of the vias, such as the via 115/125/135 and the ground via 128, may be perpendicular to the upper surface of the molding material 105.

As illustrated in FIG. 10D, a length $L_1$ of the ground trenches 117, measured along the longitudinal axis 117L of the ground trench 117, is orders of magnitude larger (e.g., 5 times to 100 times, or more) than a length $L_2$ of the ground via 128 measured along the longitudinal axis 117L, which length $L_2$ may be a same or similar to the length of other vias (e.g., 115/125/135) measured along the direction of 117L. For example, for a particular processing node, the length of a via (e.g., 115) may be in a range between about 5 μm and about 100 μm, the length $L_1$ of the ground trench (e.g., 117) may be in a range between about 25 μm and about 10000 μm, such as between 200 μm and 5000 μm.

Note that the electrically grounded shielding structure does not have to be formed along the entirety of the signal lines 113S. Instead, the electrically grounded shielding structure may be formed along segments of the signal lines 113S that are susceptible to cross-talk, e.g., at locations where the pitch between the signal line 113S and another adjacent signal line is 50 μm or less. As another example, the electrically grounded shielding structure may be formed along segments of some signal lines 113S that carry digitally modulated signals with dense constellations (e.g., 64-QAM signals, 126-QAM signals, or 256 QAM signals), since signals with dense constellations may be less resistant to cross-talk.

Modifications to the embodiment illustrated in FIGS. 1-9 and 10A-10D are possible and are fully intended to be included within the scope of the present disclosure. For example, although four dielectric layers (e.g., 110, 120, 130 and 140) are shown in FIGS. 10A-10D, more or less than four dielectric layers may be used in forming the grounded shielding structure. As another example, the ground trenches 117 are shown to be formed in the lowest (e.g., closest to the molding material 105) dielectric layer 110 in FIGS. 10A-10D, however, the ground trenches 117 may be formed in other (e.g., higher) dielectric layers. In addition, more than one layers of ground trenches may be formed. For example, a ground trench 117 may be formed directly over and connected to another underlying ground trench 117, thereby forming a double-layered ground trench. Furthermore, a ground plane may be formed over and connected to the ground trenches and/or the ground vias, thereby shielding the signal line 113S from the above, thus forming a grounded shielding structure comprising a ground plane, ground trenches, and/or ground vias. Additional embodiments illustrating the different configurations for the grounded shielding structure are discussed below. In the discussion hereinafter, unless otherwise stated, the same numeral in different figures refers to the same or similar component that is formed of the same or similar material(s) by the same or similar method, thus details are not repeated.

Figure 11A:
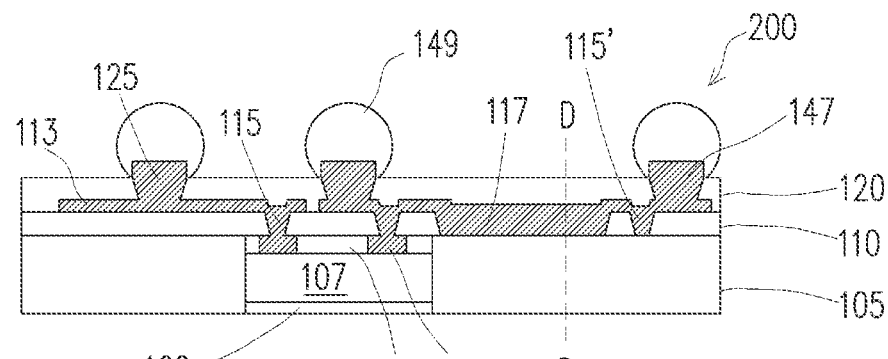
FIGS. 11A-11C illustrate cross-sectional views of a semiconductor device, in accordance with an embodiment.
Figure 11B:
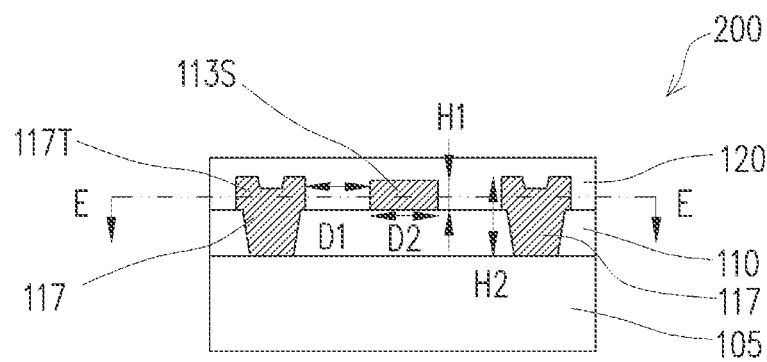
Figure 11C:
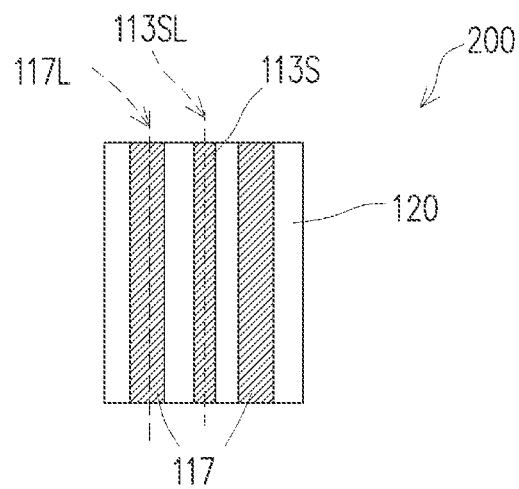

FIGS. 11A-11C illustrate cross-sectional views of a semiconductor device 200, in accordance with some embodiments. FIG. 11B is a cross-sectional view of the semiconductor device 200 shown in FIG. 11A, but along cross-section D-D. FIG. 11C is a cross-sectional view of the semiconductor device 200 shown in FIG. 11B, but along cross-section E-E. Compared with the semiconductor device 100 in FIGS. 10A-10D, the semiconductor device 200 has less dielectric layers, and does not have the ground vias 128 and the conductive lines 129 connecting the ground vias 128. Therefore, the electrically grounded shielding structure of FIGS. 11A-11C simply comprises the ground trenches 117.

As illustrated in FIGS. 11A and 11B, the semiconductor device 200 has two dielectric layers 110 and 120 over the molding material 105. Ground trenches 117 are formed in the dielectric layer 110. Signal line 113S is over the dielectric layer 110 and between the ground trenches 117. FIG. 11A illustrates a via 115' that is formed directly over (e.g., contacting) the molding material 105 and electrically coupled to the ground trench 117. In some embodiments, due to manufacturing considerations such as metal density control, the length of the ground trench 117 (e.g., measured along the direction 117L in FIG. 11C) may be subject to certain constraints and may not be formed to a sufficient length, in which case the via 115' may be formed next to the ground trench 117 and electrically coupled with the ground trench 117. The via 115' may act as an extension of the ground trench 117 to further enhance the EM shielding capability of the ground trench 117. Vias similar to the via 115' are also illustrated in FIGS. 12A, 13A, 14A, 15A, 16A, and 17A. Although one via 115' is illustrated in FIG. 11A, more than one vias 115' may be formed. These and other variations are fully intended to be included within the scope of the present disclosure.

The dimensions of the same or similar components in various embodiments may have the same or similar relationships. For example, a height $H_1$ of the signal line 113S in FIG. 11B is smaller than a height $H_2$ of the ground trench 117 in FIG. 11B, wherein $H_1$ and $H_2$ are measured along a direction perpendicular to the upper surface of the molding material 105. In other words, a ratio of $H_2/H_1$ is larger than 1. In some embodiments, a ratio of $D_1/D_2$ in FIG. 11B is larger than or equal to 0.1 and smaller than or equal to 5 (e.g., $0.1 < D_1/D_2 < 5$), where $D_2$ is the width of the signal line 113S, and $D_1$ is the distance between signal line 113S and the ground trench 117. FIG. 11C illustrates the longitudinal axis 117L of the ground trench 117, which is parallel to the longitudinal axis 113SL of the signal line 113S and parallel to the upper surface of the molding material 105.

For simplicity, the dimensions of the same or similar features in various embodiments, as well as the relationships (e.g., larger, smaller, ratio) between the dimensions of the same or similar features in various embodiments may not be repeated for each embodiment, with the understanding that the dimensions and the relationships of the dimensions of various features discussed above may apply to the same or similar features discussed hereinafter.

Figure 12A:
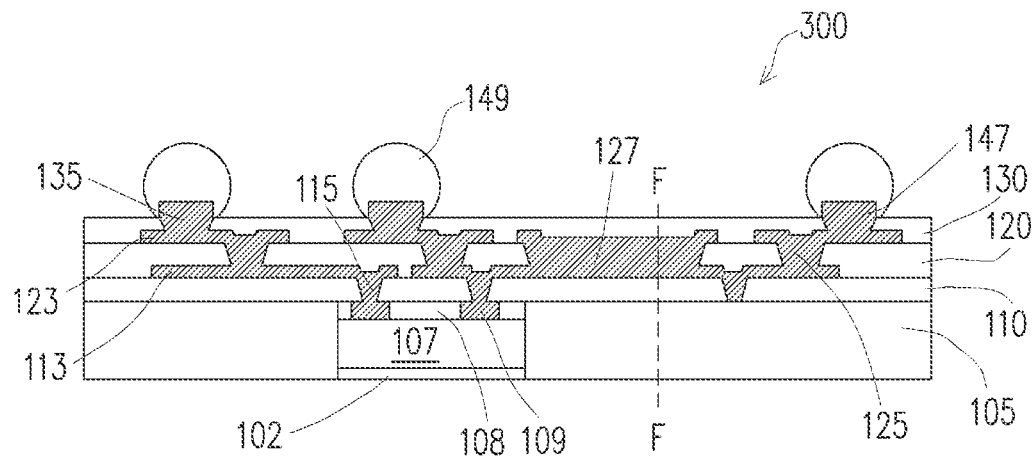
FIGS. 12A-12C illustrate cross-sectional views of a semiconductor device, in accordance with an embodiment.
Figure 12B:
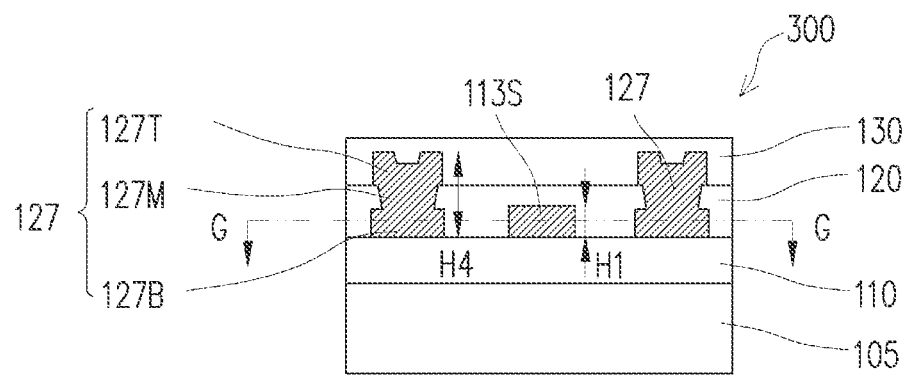
Figure 12C:
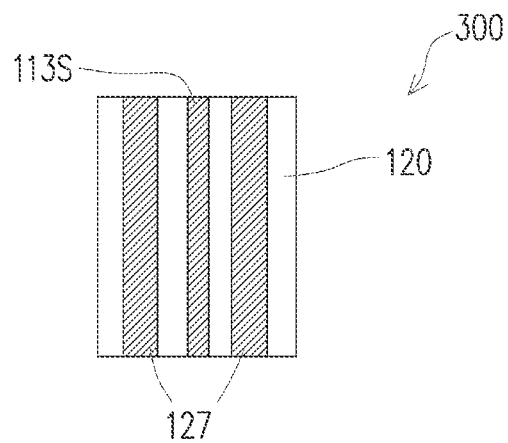

FIGS. 12A-12C illustrate cross-sectional views of a semiconductor device 300, in accordance with some embodiments. FIG. 12B is a cross-sectional view of the semiconductor device 300 shown in FIG. 12A, but along cross-section F-F. FIG. 12C is a cross-sectional view of the semiconductor device 300 shown in FIG. 12B, but along cross-section G-G. Compared with the semiconductor device 200 in FIGS. 11A-11C, the semiconductor device 300 has more (e.g., three instead of two) dielectric layers, and the ground trenches 127 are formed in the dielectric layer 120 instead of the lowest (e.g., closest to the molding material 105) dielectric layer 110. Therefore, the electrically grounded shielding structure of FIGS. 12A-12C comprises the ground trenches 127.

As illustrated in FIG. 12B, the ground trench 127 has a bottom portion 127B on the upper surface of the dielectric layer 110, a top portion 127T on the upper surface of the dielectric layer 120, and a middle portion 127M in the dielectric layer 120 and connecting the bottom portion 127B with the top portion 127T. The middle portion 127M is narrower than the top portion 127T and the bottom portion 128B, in the illustrated example of FIG. 12B. A height $H_1$ of the signal line 113S in FIG. 12B is smaller than a height $H_4$ of the ground trench 127 in FIG. 12B, wherein $H_1$ and $H_4$ are measured along the direction perpendicular to the upper surface of the molding material 105.

Figure 13A:
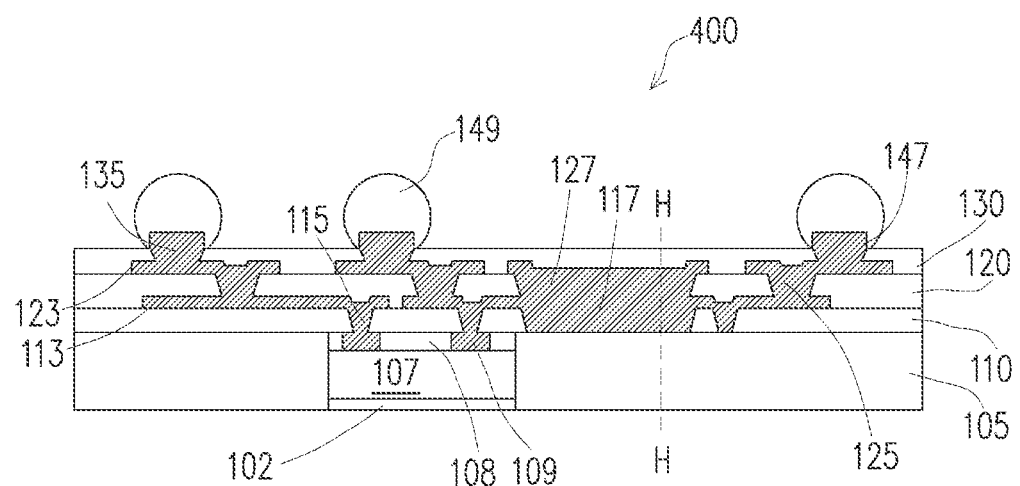
FIGS. 13A-13D illustrate cross-sectional views of a semiconductor device, in accordance with an embodiment.
Figure 13B:
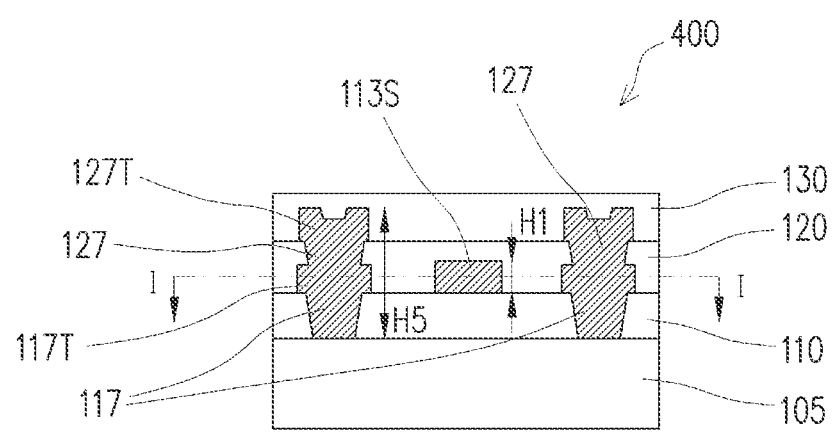
Figure 13C:
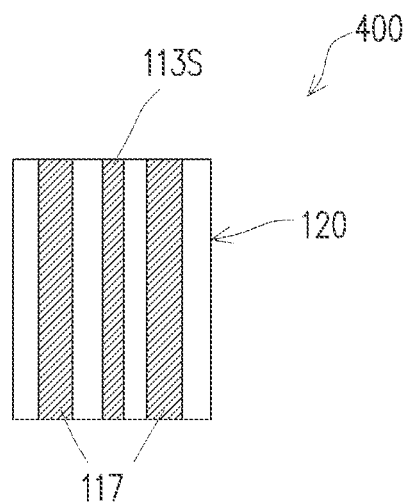

FIGS. 13A-13C illustrate cross-sectional views of a semiconductor device 400, in accordance with some embodiments. FIG. 13B is a cross-sectional view of the semiconductor device 400 shown in FIG. 13A, but along cross-section H-H. FIG. 13C is a cross-sectional view of the semiconductor device 400 shown in FIG. 13B, but along cross-section I-I.

The electrically grounded shielding structure of semiconductor device 400 comprises a lower ground trench 117 in dielectric layer 110 and an upper ground trench 127 in dielectric layer 120. Therefore, the embodiment of FIGS. 13A-13C may be considered as a combination of the embodiment of FIGS. 11A-11C and the embodiment of FIGS. 12A-12C. In accordance with some embodiments, a height $H_1$ of the signal line 113S in FIG. 13B is smaller than a height $H_5$ of the electrically grounded shielding structure comprising the lower ground trench 117 and the upper ground trench 127. In particular, a ratio of $H_5/H_1$ may be between about 2 and about 8.

Figure 13D:
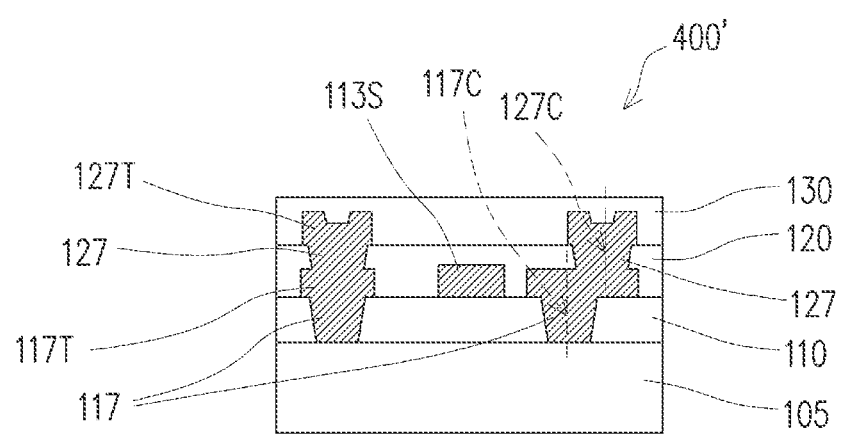

In FIG. 13B, the center axis of the upper ground trench 127 is aligned with (e.g., on a same line with) the center axis of the underlying lower ground trench 117. In alternative embodiments, such as illustrated by the semiconductor device 400' of FIG. 13D, the center axis 127C of the upper ground trench 127 on the right is not aligned with (e.g., on a different line from) the center axis 117C of the lower ground trench 117 on the right. In some embodiments, a distance between the lower ground trenches 117 on the left and on the right is different from a distance between the upper ground trench 127 on the left and on the right. Although not illustrated, both the upper ground trenches 127 (e.g., on the left and on the right) may be misaligned with the respective underlying lower ground trenches 117. These and other variations are fully intended to be included within the scope of the present disclosure.

Figure 14A:
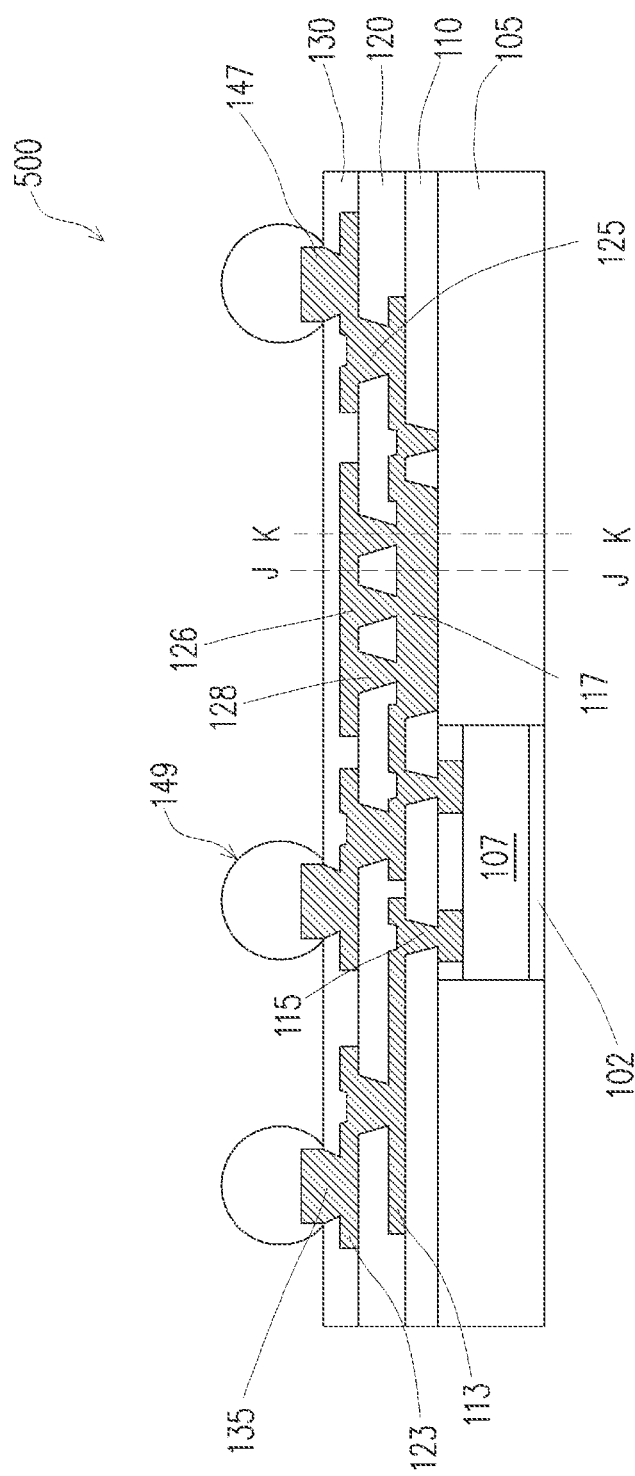
FIGS. 14A-14E illustrate cross-sectional views of a semiconductor device, in accordance with an embodiment.
Figure 14B:
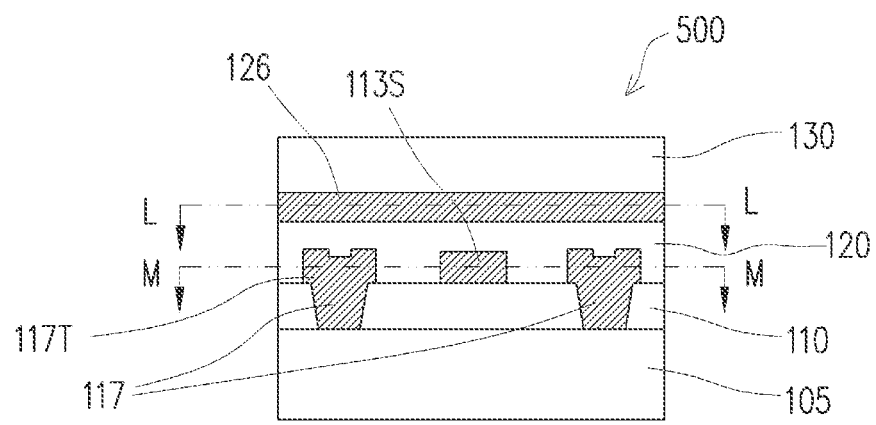
Figure 14C:
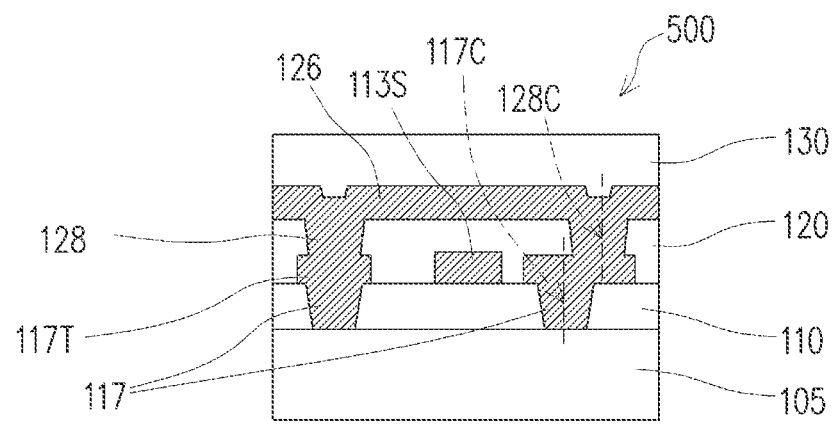
Figure 14D:
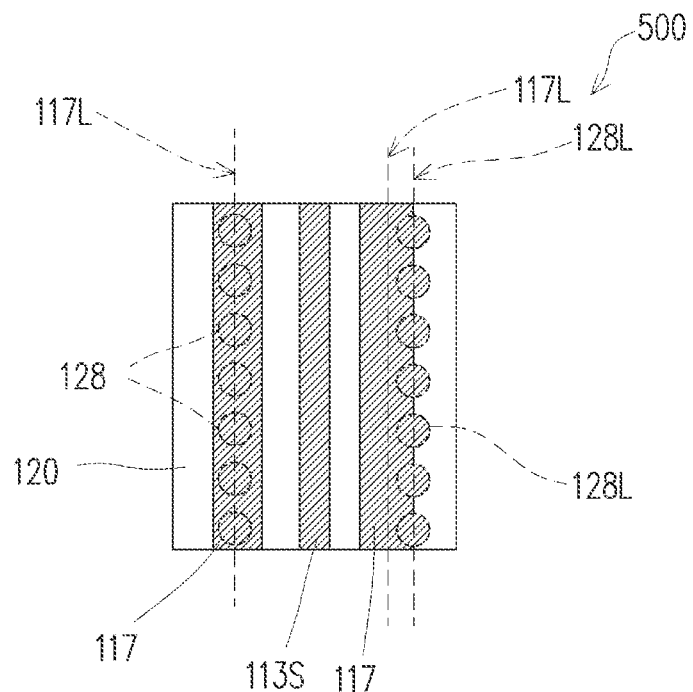
Figure 14E:
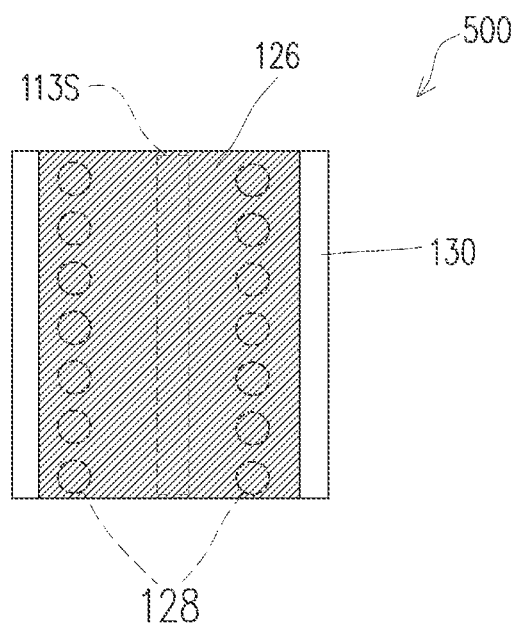

FIGS. 14A-14E illustrate cross-sectional views of a semiconductor device 500, in accordance with some embodiments. FIGS. 14B and 14C are cross-sectional views of the semiconductor device 500 shown in FIG. 14A, but along cross-sections J-J and K-K, respectively. FIGS. 14D and 14E are cross-sectional views of the semiconductor device 500 shown in FIG. 14B, but along cross-sections M-M and L-L, respectively.

The semiconductor device 500 is similar to the semiconductor device 100 illustrated in FIGS. 10A-10D, but with three dielectric layers instead of four dielectric layers over the molding material 105. In addition, the semiconductor device 500 has a ground plane 126 formed on the upper surface of the dielectric layer 120, which ground plane 126 is electrically connected to the ground vias 128 and the ground trench 117. Therefore, the electrically grounded shielding structure of the semiconductor device 500 comprises the ground trenches 117, the ground vias 128, and the ground plane 126.

Referring to FIGS. 14B and 14C, the ground trenches 117 extend through the dielectric layer 110, and have upper portions 117T on the upper surface of the dielectric layer 110. The ground vias 128 are formed in the dielectric layer 120 over the ground trenches 117. The ground plane 126 are formed on the upper surface of the dielectric layer 120, and extends continuously over the signal line 113S and the ground vias 128 disposed on opposing sides of the signal line 113S. The ground plane is electrically and mechanically coupled to the ground vias 128.

As illustrated in FIG. 14C, the ground vias 128 on the left are aligned with (e.g., disposed directly over) the underlying ground trench 117. The ground vias 128 on the right are not aligned with the underlying ground trench 117. For example, the center axis 128C of the ground vias 128 on the right is misaligned (e.g., not on a same line) with the center axis 117C of the underlying ground trench 117.

As illustrated in FIG. 14D, the centers of the plurality of ground vias 128 on the left are aligned (e.g., overlap) with the longitudinal axis 117L of the underlying ground trench 117. The centers of the plurality of ground vias 128 on the right, however, are on a line 128L which is parallel to, but not overlapping with, the longitudinal axis 117L of the underlying ground trench 117.

FIG. 14E illustrates the ground plane 126, which extends continuously from the ground vias 128 (shown in phantom) on the left to the ground vias 128 on the right. Also illustrated in FIG. 14E is the signal line 113S (shown in phantom), which is between the ground vias 128 on the left and the ground vias on the right. The ground plane 126 is electrically connected to the ground vias 128 and the ground trenches 117, thus shielding the signal line 113S from the top to further reduce cross-talk.

Variations are possible and are fully intended to be included within the scope of the present disclosure. In some embodiments, the ground vias 128 on the left and on the right are aligned with respective underlying ground trenches 117. In some embodiments, the ground vias 128 on the left and on the right are misaligned with respective underlying ground trenches 117. As another example, the lateral distance between the signal line 113S and the ground via 128 (e.g., the ground via 128 on the left or on the right) may be larger than or smaller than the lateral distance between the signal line 113S and the ground trench 117 underlying the ground via 128.

Figure 15A:
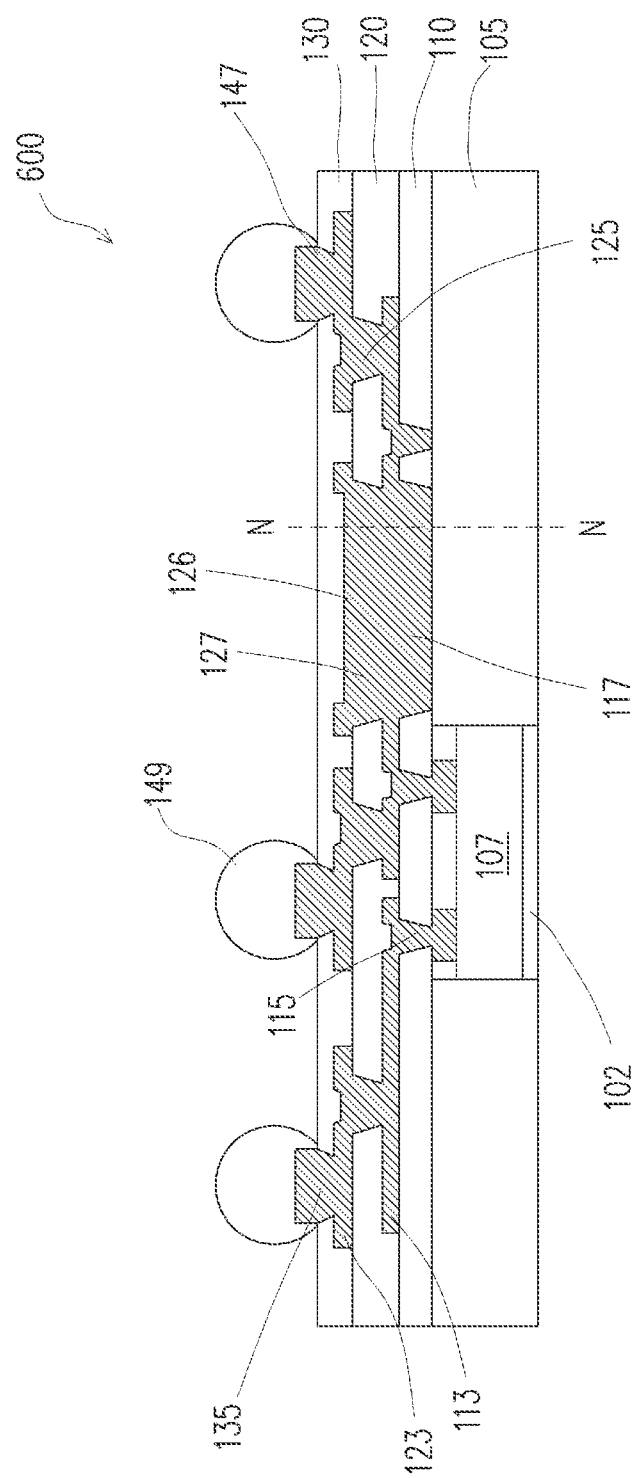
FIGS. 15A-15D illustrate cross-sectional views of a semiconductor device, in accordance with an embodiment.
Figure 15B:
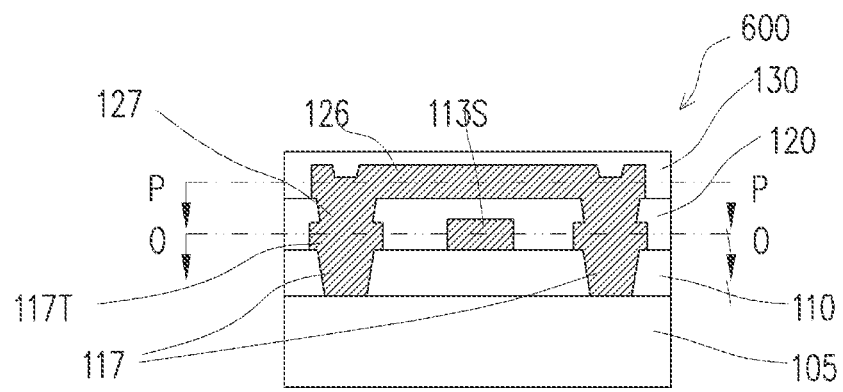
Figure 15C:
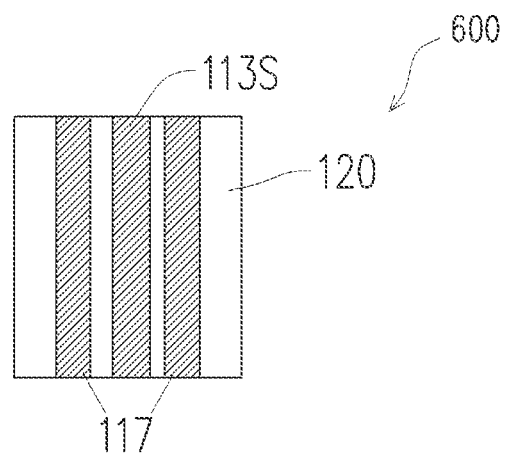
Figure 15D:
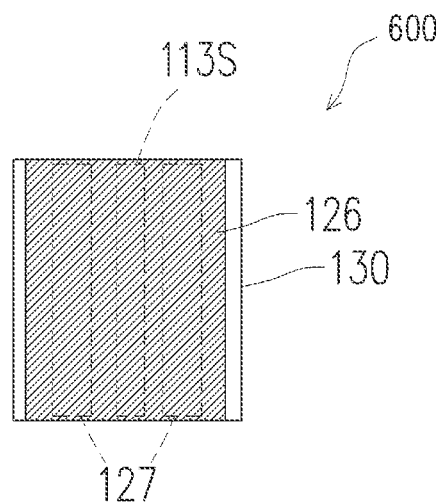

FIGS. 15A-15D illustrate cross-sectional views of a semiconductor device 600, in accordance with some embodiments. FIG. 15B is a cross-sectional view of the semiconductor device 600 shown in FIG. 15A, but along cross-section N-N. FIGS. 15C and 15D are cross-sectional views of the semiconductor device 600 shown in FIG. 15B, but along cross-section O-O and P-P, respectively.

The semiconductor device 600 is similar to the semiconductor device 500 illustrated in FIGS. 14A-14E, but with the ground vias 128 replaced with upper ground trenches 127. To distinguish the ground trenches 117 (formed in the dielectric layer 110) from the upper ground trenches 127 (formed in the dielectric layer 120), the ground trenches 117 are referred to as the lower ground trenches in the discussion of the semiconductor device 600. Therefore, the electrically grounded shielding structure of the semiconductor device 600 comprises the lower ground trenches 117, the upper ground trenches 127, and the ground plane 126.

FIG. 15C shows the lower ground trenches extending parallel to the signal line 113S. FIG. 15D shows the ground plane 126 extending continuously over the upper ground trenches 127 (shown in phantom) and the signal line 113S (shown in phantom).

Figure 15E:
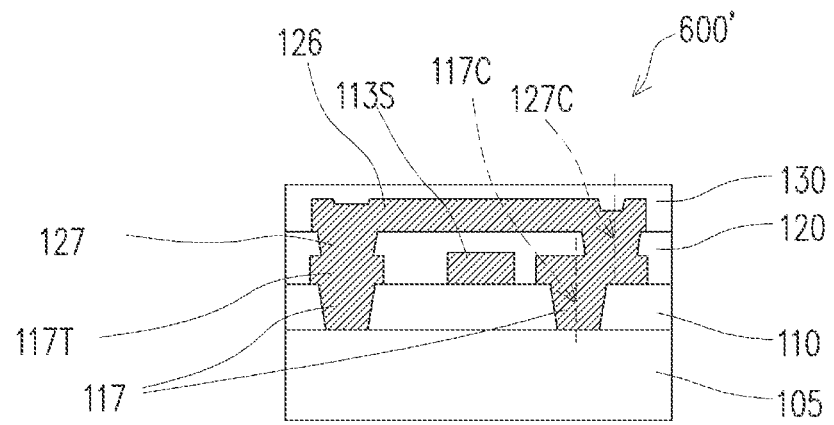
FIG. 15E and FIG. 15F each illustrates a cross-sectional view of a semiconductor device, in accordance with some embodiments.
Figure 15F:
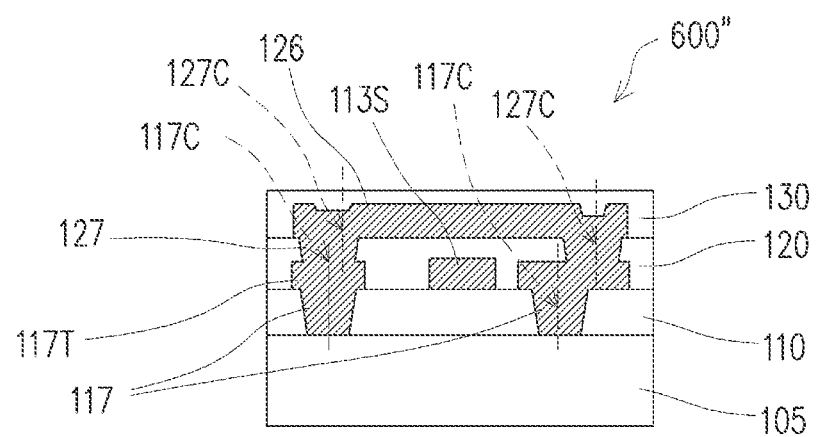

In FIG. 15B, the upper ground trenches 127 are shown to be vertically aligned (e.g., directly over) with the underlying lower ground trenches 117. This is merely a non-limiting example. In another embodiment, a semiconductor device 600' illustrated in FIG. 15E has similar structures as the semiconductor device 600, but with the upper ground trench 127 on the right misaligned with the underlying lower ground trench 117. For example, the center axis 127C of the upper ground trench 127 on the right is not on a same line as the center axis 117C of the underlying ground trench 117. In yet another embodiment, as illustrated in FIG. 15F, a semiconductor device 600" has similar structures as the semiconductor device 600, but with the upper ground trenches 127 on the left and on the right misaligned with the respective underlying ground trenches 117. In particular, the center axis 127C of the upper ground trench 127 on the right is further from the signal line 113 than the center axis 117C of the underlying ground trench 117, and the center axis 127C of the upper ground trench 127 on the left is closer to the signal line 113 than the center axis 117C of the underlying ground trench 117. Various modifications are possible and are fully intended to be included within the scope of the present disclosure.

Figure 16A:
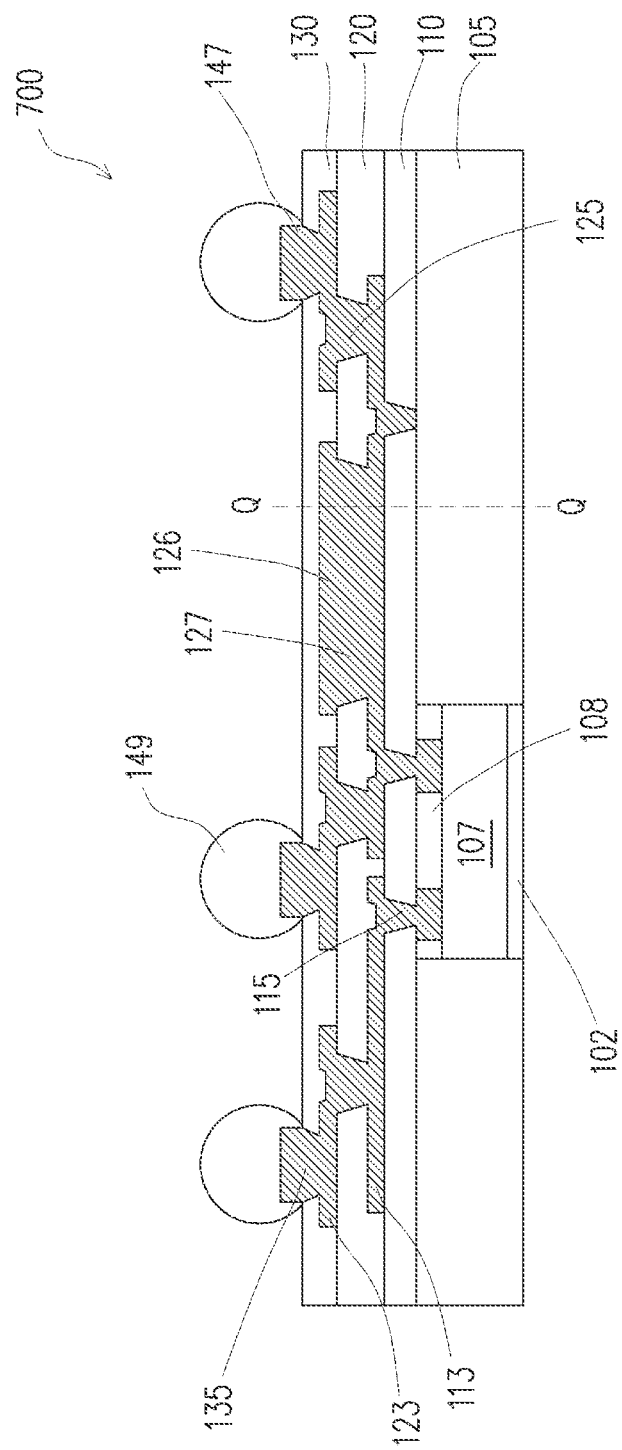
FIGS. 16A-16D illustrate cross-sectional views of a semiconductor device, in accordance with an embodiment.
Figure 16B:
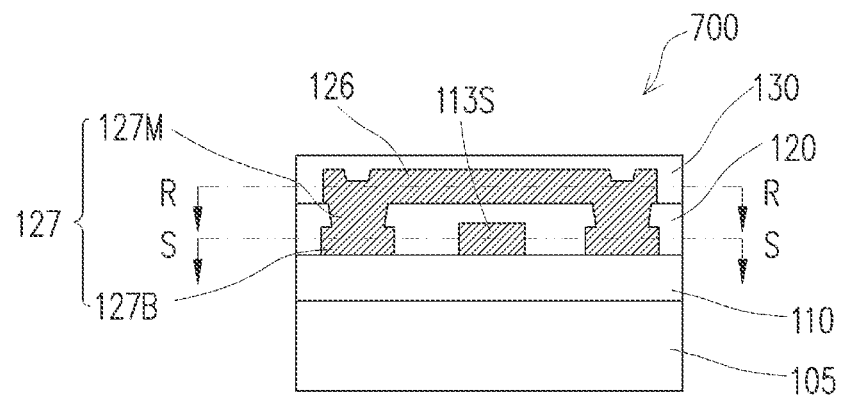
Figure 16C:
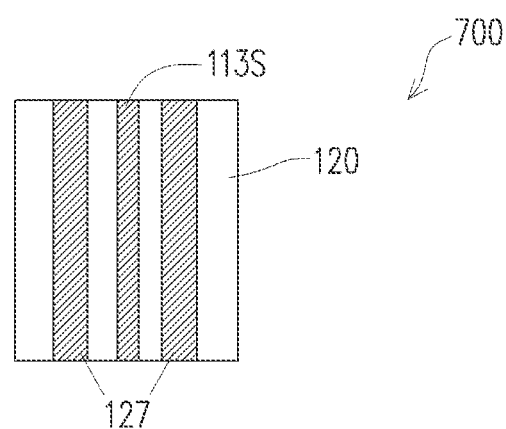
Figure 16D:
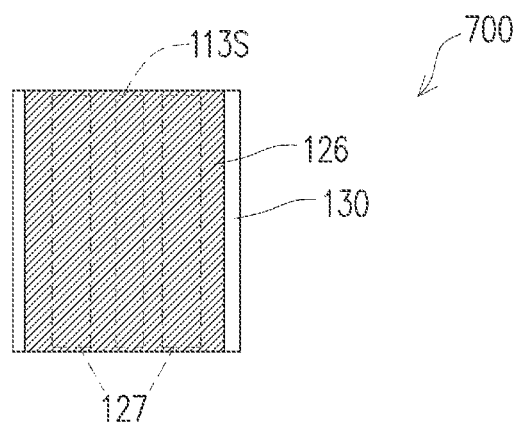

FIGS. 16A-16D illustrate cross-sectional views of a semiconductor device 700, in accordance with some embodiments. FIG. 16B is a cross-sectional view of the semiconductor device 700 shown in FIG. 16A, but along cross-section Q-Q. FIGS. 16C and 16D are cross-sectional views of the semiconductor device 700 shown in FIG. 16B, but along cross-section S-S and R-R, respectively.

The semiconductor device 700 is similar to the semiconductor device 600 illustrated in FIGS. 15A-15D, but with the lower ground trenches 117 removed. Therefore, the electrically grounded shielding structure of the semiconductor device 700 comprises the upper ground trenches 127 and the ground plane 126.

As illustrated in FIG. 16B, the upper ground trenches 127 has a bottom portion 127B on the upper surface of the dielectric layer 120 and a middle portion 127M in the dielectric layer 120 and over the bottom portion 127B. Portions of the upper ground trenches 127 over the dielectric layer 120 merge with the ground plane 126, and may be considered as part of the ground plane 126, thus are not labeled. In the illustrated example of FIG. 16B, the bottom portion 127B has a width larger than a width of the middle portion 127M.

Figure 17A:
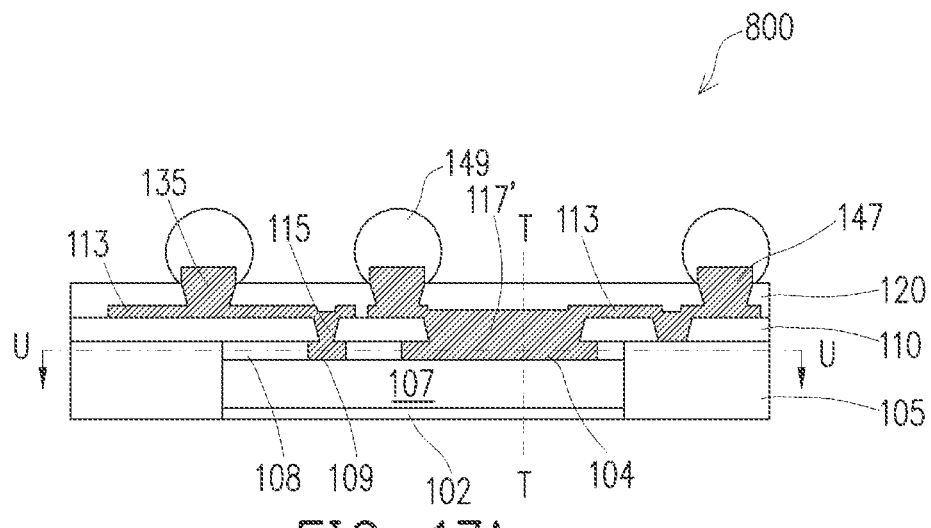
FIGS. 17A-17D illustrate cross-sectional views of a semiconductor device, in accordance with an embodiment.
Figure 17B:
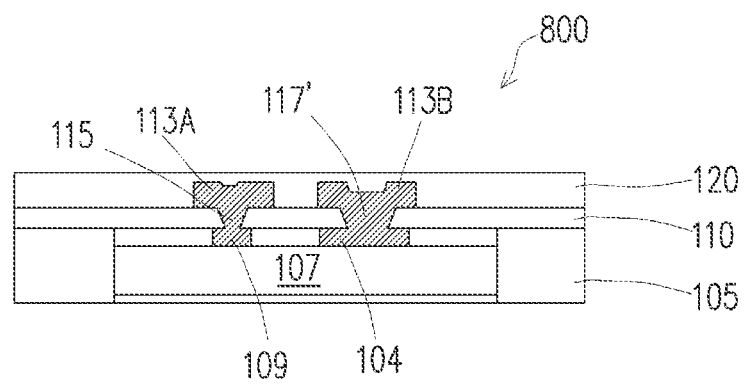
Figure 17C:
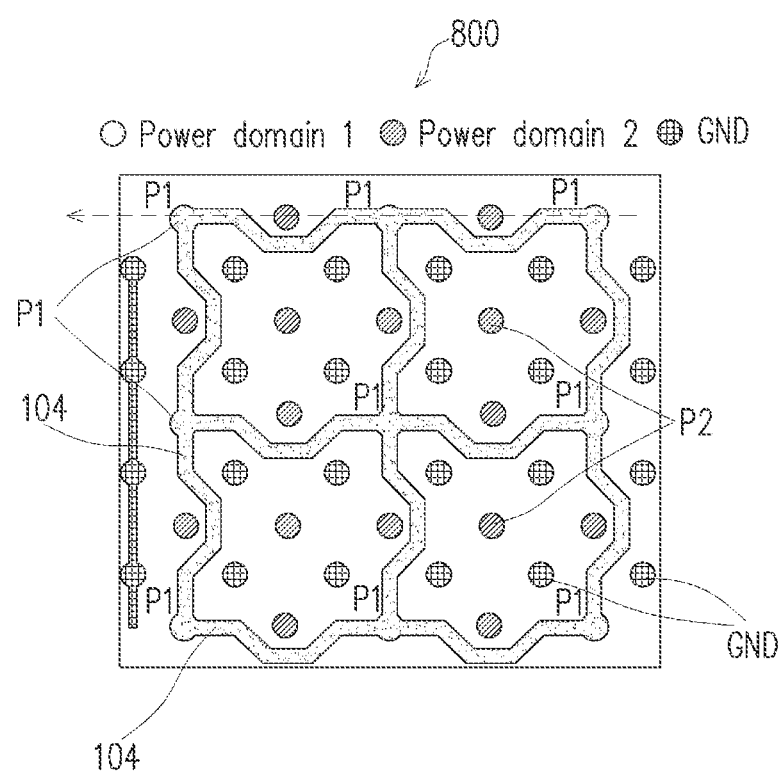
Figure 17D:
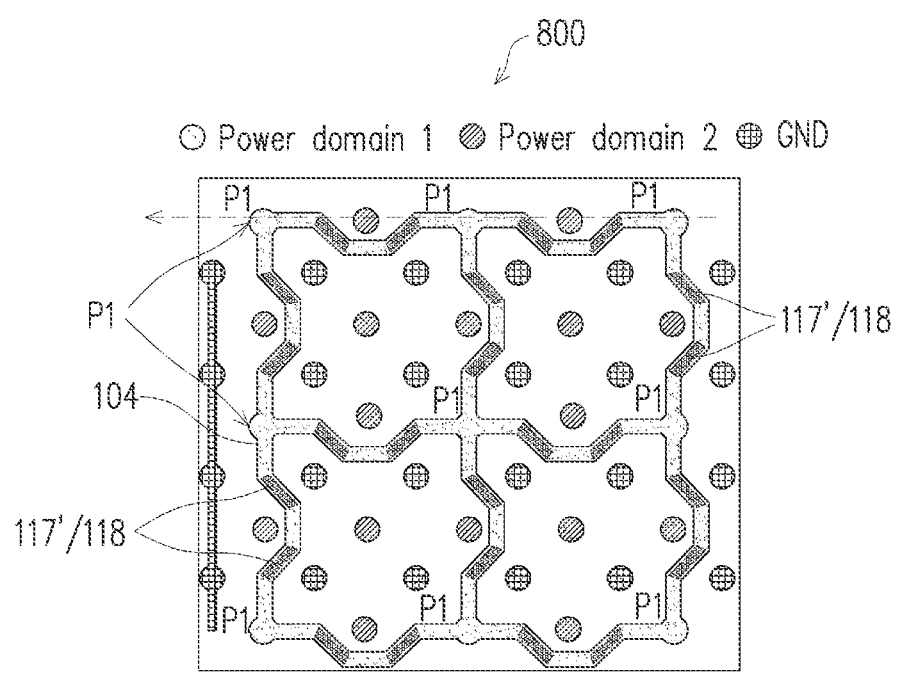

FIGS. 17A-17D illustrate cross-sectional views of a semiconductor device 800, in accordance with some embodiments. FIG. 17B is a cross-sectional view of the semiconductor device 800 shown in FIG. 17A, but along cross-section T-T. FIGS. 17C and 17D are cross-sectional views of the semiconductor device 800 shown in FIG. 17B, but along cross-section U-U.

Referring to FIG. 17A, an electrically conductive feature 117' is formed in the dielectric layer 110 using similar material and formation method as the ground trench 117 in other embodiments, such as in FIGS. 11A-11C. However, unlike the ground trench 117 which is electrically grounded and used as (part of) a shielding structure to reduce crosstalk, the electrically conductive feature 117' is electrically connected to a line via 104 and used to reduce DC resistance, which in turn reduces the IR drop of the semiconductor device 800.

As illustrated in FIGS. 17A-17C, the line via 104 comprises electrically conductive paths (see 104 in FIG. 17C) formed in the dielectric material 108 of the die 107, which dielectric material 108 surrounds the die connectors 109. While the die connectors 109 route signals (e.g., electrical current) in a direction perpendicular to the upper surface of the die 107 and has cross-sections (e.g., in a top view) such as circles, ovals, squares, or rectangles, the line vias 104 route signals in a plane substantially parallel to the upper surface of the die 107 and has cross-sections (e.g., in the top view) comprising segments of conductive lines. For example, FIG. 17C shows the line vias 104 as conductive lines connecting a plurality of contact pads P1 (may also be referred to power contact pads) of the die 107, which contact pads P1 are electrically coupled to a power supply of the die 107 denoted as power domain 1. FIG. 17C also illustrates a plurality of contact pads P2 of the die 107, which are electrically coupled to another power supply of the die 107 denoted as power domain 2. FIG. 17C further illustrates a plurality of contact pads GND of the die 107, which are electrically coupled to the electrical ground. The die 107 may have other contact pads, such as contact pads for routing control and data signals, which are not shown in FIG. 17C.

FIG. 17D is similar to FIG. 17C, but with the electrically conductive features 117', which are not visible in the cross-sectional view of FIG. 17C, shown in phantom to illustrate the locations of the electrically conductive features 117' relative to the line vias 104. As illustrated in FIG. 17D, the electrically conductive features 117' are formed directly over the line vias 104, and therefore, overlap the line vias 104, in some embodiments. The electrically conductive features 117' may completely overlap the line vias 104 and thus, comprises continuous conductive paths connecting power contact pads P1, in some embodiments. In other embodiments, the electrically conductive features 117' may be formed over segments of the line vias 104, and therefore, comprises discrete segments 118 that are separated from each other. A longitudinal axis of the electrically conductive features 117' is parallel to the front side of the die 107, or parallel to the upper surface of the molding material 105, in some embodiments.

The electrically conductive features 117' effectively increase the thickness and/or the volume of the line vias 104, thus reducing the DC resistance of the power contact pads P1, which in turn reduces the IR drop of the die 107. In advanced semiconductor process node, the power supply voltage drops from higher voltage, e.g., 5 V to lower voltage such as 1.2 V. Since the power consumption of the chip may remain the same or even increase due to more functionality being integrated into the chip, the current of the chip increases. The increased chip current poses more stringent requirements for the IR drop of the chip, since the same DC resistance in a higher voltage (e.g., 5V) design may result in unacceptable IR drop in the lower voltage (e.g., 1.2V) design. The embodiment of FIGS. 17A-17D reduces the DC resistance of the power contact pads P1, thus making it easier for the chip design in advanced process node to meet the stringent IR drop requirements.

Figure 18:
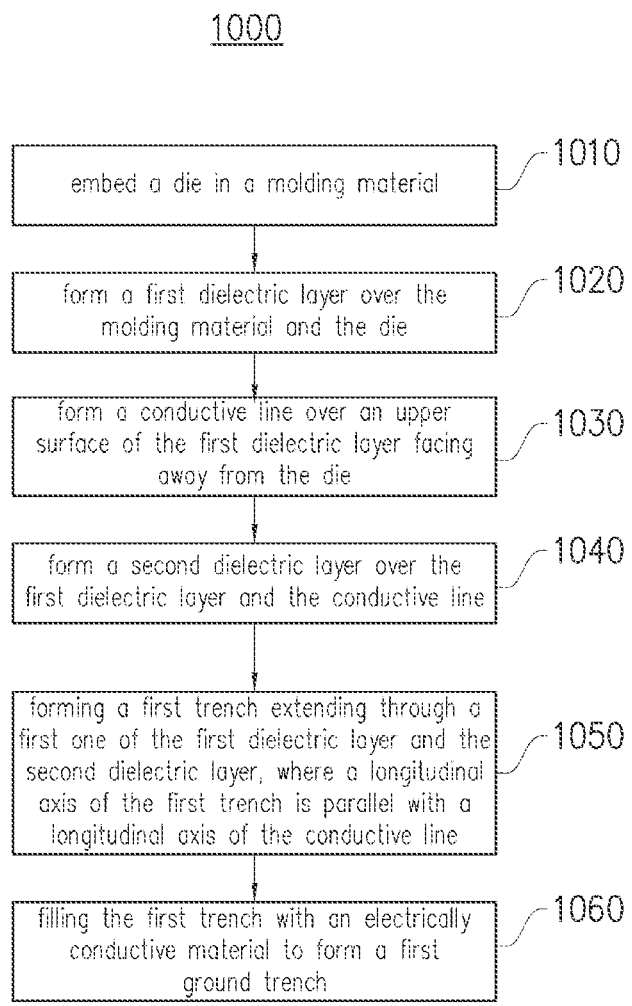
FIG. 18 illustrates a flow chart of method of making a semiconductor device, in accordance with some embodiments.

FIG. 18 illustrates a flow chart of a method of forming a semiconductor device, in accordance with some embodiments. It should be understood that the embodiment method shown in FIG. 18 is merely an example of many possible embodiment methods. One of ordinary skill in the art would recognize many variations, alternatives, and modifications. For example, various steps as illustrated in FIG. 18 may be added, removed, replaced, rearranged and repeated.

Referring to FIG. 18, at step 1010, a die is embedded in a molding material. At step 1020, a first dielectric layer is formed over the molding material and the die. At step 1030, a conductive line is formed over an upper surface of the first dielectric layer facing away from the die. At step 1040, a second dielectric layer is formed over the first dielectric layer and the conductive line. At step 1050, a first trench is formed extending through a first one of the first dielectric layer and the second dielectric layer, where a longitudinal axis of the first trench is parallel with a longitudinal axis of the conductive line. At step 1060, the first trench is filled with an electrically conductive material to form a first ground trench.

Embodiments may achieve advantages. The electrically grounded shielding structure may be formed in the same processing steps as forming the redistribution structures. Due to the simple structures of the disclosed embodiments, low production cost is achieved. Simulation results have shown that the disclosed embodiments effectively reduces cross-talk. For example, compared with a design without the presently disclosed features, the presently disclosed embodiments provide about 5 dB or more reduction in cross-talk from 1 GHz to about 10 GHz. In addition, the disclosed embodiment in FIGS. 17A-17D provides a low-cost design that can reduce the DC resistance and IR drop of the die 107, which may improve the performance of the die 107 and help to meet the stringent IR drop requirements for chip design in advanced process nodes.

In an embodiment, a semiconductor device includes a die; a molding material around the die; a first dielectric layer over the die and the molding material, the first dielectric layer having a first surface facing the die and a second surface opposing the first surface; a conductive line along the second surface of the first dielectric layer; and a second dielectric layer over the first dielectric layer and the conductive line, the second dielectric layer having a third surface facing the die and a fourth surface opposing the third surface. The semiconductor device further includes a first conductive structure laterally spaced from and parallel with at least a first portion of the conductive line, where the first conductive structure is configured to be electrically grounded or connected to a power supply; and a second conductive structure laterally spaced from and parallel with at least the first portion of the conductive line, where the first portion of the conductive line is between the first conductive structure and the second conductive structure, where a first portion of the first conductive structure and a first portion of the second conductive structure are between the first surface and the second surface or between the third surface and the fourth surface, and where a longitudinal axis of the first portion of the first conductive structure and a longitudinal axis of the first portion of the second conductive structure are parallel to the first surface of the first dielectric layer. In an embodiment, the conductive line has a first height, where the first conductive structure and the second conductive structure have a second height larger than the first height, where the first height and the second height are measured along a direction perpendicular to an upper surface of the molding material. In an embodiment, the first conductive structure and the second conductive structure extend through the first dielectric layer and the second dielectric layer. In an embodiment, each of the first conductive structure and the second conductive structure includes a lower ground trench in the first dielectric layer and an upper ground trench in the second dielectric layer, the lower ground trench connected to the upper ground trench. In an embodiment, a distance between the lower ground trench of the first conductive structure and the lower ground trench of the second conductive structure is different from a distance between the upper ground trench of the first conductive structure and the upper ground trench of the second conductive structure. In an embodiment, the first conductive structure includes a first ground trench that extends through the first dielectric layer, and the second conductive structure includes a second ground trench that extends through the first dielectric layer. In an embodiment, the first conductive structure further includes first plurality of ground vias in the second dielectric layer and connected to the first ground trench, and the second conductive structure further includes second plurality of ground vias in the second dielectric layer and connected to the second ground trench. In an embodiment, the semiconductor device further includes a ground plane over the fourth surface of the second dielectric layer, where the ground plane extends over the conductive line, the first conductive structure and the second conductive structure, and where the ground plane is connected to the first plurality of ground vias and the second plurality of ground vias. In an embodiment, the first conductive structure includes a first ground trench that extends through the second dielectric layer, and the second conductive structure includes a second ground trench that extends through the second dielectric layer. In an embodiment, the semiconductor device further includes a ground plane over the fourth surface of the second dielectric layer, where the ground plane extends over the conductive line, the first ground trench and the second ground trench, and where the ground plane is connected to the first ground trench and the second ground trench.

In an embodiment, a method includes embedding a die in a molding material; forming a first dielectric layer over the molding material and the die; forming a conductive line over an upper surface of the first dielectric layer facing away from the die; forming a second dielectric layer over the first dielectric layer and the conductive line; forming a first trench opening extending through the first dielectric layer or the second dielectric layer, where a longitudinal axis of the first trench is parallel with a longitudinal axis of the conductive line, and where no electrically conductive feature is exposed at a bottom of the first trench opening; and filling the first trench opening with an electrically conductive material to form a first ground trench. In an embodiment, a bottom of the first ground trench contacts the molding material. In an embodiment, a first height of the first ground trench is larger than a second height of the conductive line, where the first height and second height are measured along a direction perpendicular to the upper surface of the first dielectric layer. In an embodiment, the first trench opening extends through the first dielectric layer, where the method further includes forming a second trench opening extending through the second dielectric layer, where a longitudinal axis of the second trench opening is parallel with the longitudinal axis of the conductive line; and filling the second trench opening with the electrically conductive material to form a second ground trench, the second ground trench electrically and mechanically coupled to the first ground trench. In an embodiment, a first lateral distance between the conductive line and the first ground trench is different from a second lateral distance between the conductive line and the second ground trench. In an embodiment, the first trench opening extends through the first dielectric layer, where the method further includes forming a plurality of ground vias in the second dielectric layer, where the plurality of ground vias is aligned on a line that is parallel to the longitudinal axis of the conductive line, and where the plurality of ground vias is electrically and mechanically coupled to the first ground trench. In an embodiment, the method further includes forming a ground plane over an upper surface of the second dielectric layer, where the ground plane extends over the conductive line and the plurality of ground vias, and where the ground plane is electrically and mechanically coupled to the plurality of ground vias.

In an embodiment, a device includes a die that includes a conductive pillar and a line via that are in a same dielectric layer on a front side of the die, where the conductive pillar and the line via are electrically coupled to respective contact pads of the die, and where the line via comprises a conductive path extending parallel to the front side of the die; a molding material around the die; a first dielectric layer over the molding material and the die; a first conductive line over the first dielectric layer; and an electrically conductive structure extending through the first dielectric layer and connected to the line via and the first conductive line, where a longitudinal axis of the electrically conductive structure is parallel to the front side of the die. In an embodiment, the line via is electrically coupled to a contact pad of the die that is configured to be coupled to a power supply voltage. In an embodiment, the device further includes a second conductive line over the first dielectric layer; and a via in the first dielectric layer, where the via is connected to the second conductive line and the conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a die embedded in a molding material;
a first dielectric layer over the die and the molding material;
a conductive line along an upper surface of the first dielectric layer distal to the die;
a second dielectric layer over the first dielectric layer and the conductive line; and
a first conductive structure and a second conductive feature on opposing sides of the conductive line and spaced apart from the conductive line, wherein the first conductive feature and the second conductive feature extend through at least the first dielectric layer or the second dielectric layer, wherein a first longitudinal axis of the first conductive feature and a second longitudinal axis of the second conductive feature are parallel to a third longitudinal axis of the conductive line.

2. The semiconductor device of claim 1, wherein the conductive line has a first height measured along a first direction perpendicular to an upper surface of the molding material, wherein the first conductive structure and the second conductive structure have a second height measured along the first direction, where a ratio between the second height and the first height is larger than 1.

3. The semiconductor device of claim 1, wherein a width of the conductive line is D2, and a distance between the conductive line and the first conductive structure is D1, wherein a ratio between D1 and D2 is between about 0.1 and about 5.

4. The semiconductor device of claim 1, wherein the first conductive structure comprises a first ground trench that extends through the first dielectric layer, and the second conductive structure comprises a second ground trench that extends through the first dielectric layer.

5. The semiconductor device of claim 4, wherein the first conductive structure further comprises a first plurality of ground vias in the second dielectric layer and connected to the first ground trench, and the second conductive structure further comprises a second plurality of ground vias in the second dielectric layer and connected to the second ground trench.

6. The semiconductor device of claim 5, further comprising a ground plane over the second dielectric layer and connected to the first plurality of ground vias and to the second plurality of ground vias, wherein the ground plane extends continuously from the first plurality of ground vias to the second plurality of ground vias.

7. The semiconductor device of claim 5, wherein the first plurality of ground vias are disposed along a first line parallel to the third longitudinal axis of the conductive line, and the second plurality of ground vias are disposed along a second line parallel to the first line.

8. The semiconductor device of claim 7, wherein in a top view, a first distance between the first line and the third longitudinal axis is smaller than a second distance between the second line and the third longitudinal axis.

9. The semiconductor device of claim 1, wherein the first conductive structure and the second conductive structure extend through the first dielectric layer and the second dielectric layer.

10. The semiconductor device of claim 9, wherein each of the first conductive structure and the second conductive structure comprises a lower ground trench in the first dielectric layer and an upper ground trench in the second dielectric layer, the lower ground trench connected to the upper ground trench.

11. The semiconductor device of claim 10, wherein a first distance between the lower ground trench of the first conductive structure and the lower ground trench of the second conductive structure is different from a second distance between the upper ground trench of the first conductive structure and the upper ground trench of the second conductive structure.

12. The semiconductor device of claim 10, further comprising a ground plane over the second dielectric layer and connected to the upper ground trench of the first conductive structure and the upper ground trench of the second conductive structure, wherein the ground plane extends continuously from the upper ground trench of the first conductive structure to the upper ground trench of the second conductive structure.

13. A semiconductor device comprising:
a die surrounded by a molding material;
a first dielectric layer over the molding material;
a conductive line along a first surface of the first dielectric layer facing away from the die;

a second dielectric layer over the conductive line and the first dielectric layer; and an electromagnetic (EM) shielding structure at least partially in the first dielectric layer or the second dielectric layer, the EM shielding structure comprising:

a first conductive feature on a first side of the conductive line; and a second conductive feature on a second opposing side of the conductive line, wherein longitudinal axes of the first conductive feature and the second conductive feature are parallel to a first longitudinal axis of the first conductive line.

14. The semiconductor device of claim 13, wherein a first bottom surface of the first conductive feature and a second bottom surface of the second conductive feature are in physical contact with the molding material, wherein the first bottom surface and the second bottom surface face the molding material.

15. The semiconductor device of claim 13, wherein the first conductive feature comprises a first ground trench in the first dielectric layer, and the second conductive feature comprises a second ground trench in the first dielectric layer.

16. The semiconductor device of claim 15, further comprising a ground plane over the second dielectric layer, the ground plane extending over the first ground trench, the conductive line, and the second ground trench, the ground plane electrically coupled to the first ground trench and the second ground trench.

17. A method comprising:

embedding a die in a molding material;

forming a first dielectric layer over the molding material and the die;

forming a conductive line over an upper surface of the first dielectric layer facing away from the die;

forming a first trench opening extending through the first dielectric layer, wherein a longitudinal axis of the first trench opening is parallel with the upper surface of first dielectric layer, and the molding material is exposed at a bottom of the first trench opening; and filling the first trench opening with an electrically conductive material to form a first ground trench.

18. The method of claim 17, wherein the first ground trench is formed to have a first height larger than a second height of the conductive line, wherein the first height and the second height are measured along a direction perpendicular to the upper surface of the first dielectric layer.

19. The method of claim 17, further comprising:

forming a second dielectric layer over the first dielectric layer; and forming a plurality of ground vias in the second dielectric layer, wherein the plurality of ground vias is disposed along on a line parallel to a longitudinal axis of the conductive line, wherein the plurality of ground vias is electrically and mechanically coupled to the first ground trench.

20. The method of claim 17, further comprising:

forming a second dielectric layer over the first dielectric layer;

forming a second trench opening extending through the second dielectric layer, wherein a longitudinal axis of the second trench opening is parallel with a longitudinal axis of the conductive line, the second trench opening exposing the first ground trench; and filling the second trench opening with the electrically conductive material to form a second ground trench.

* * * * *